United States Patent
Ferreira et al.

(10) Patent No.: US 12,242,371 B2
(45) Date of Patent: Mar. 4, 2025

(54) BOOTSTRAP METHOD FOR CONTINUOUS DEPLOYMENT IN CROSS-CUSTOMER MODEL MANAGEMENT

(71) Applicant: Dell Products L.P., Round Rock, TX (US)

(72) Inventors: Paulo Abelha Ferreira, Rio de Janeiro (BR); Vinicius Michel Gottin, Rio de Janeiro (BR); Pablo Nascimento da Silva, Niterói (BR)

(73) Assignee: Dell Products L.P., Round Rock, TX (US)

( * ) Notice: Subject to any disclaimer, the term of this patent is extended or adjusted under 35 U.S.C. 154(b) by 108 days.

(21) Appl. No.: 18/158,587

(22) Filed: Jan. 24, 2023

(65) Prior Publication Data

US 2024/0248836 A1    Jul. 25, 2024

(51) Int. Cl.
*G06N 20/00*       (2019.01)
*G06F 11/3668*     (2025.01)
*G06F 30/27*       (2020.01)
*G06N 3/08*        (2023.01)

(52) U.S. Cl.
CPC ...... *G06F 11/3688* (2013.01); *G06F 11/3692* (2013.01); *G06F 30/27* (2020.01); *G06N 3/08* (2013.01)

(58) Field of Classification Search
CPC .. G06F 11/3688; G06F 11/3692; G06F 30/27; G06N 3/08
See application file for complete search history.

(56) References Cited

U.S. PATENT DOCUMENTS

| | | | |
|---|---|---|---|
| 2011/0282169 A1* | 11/2011 | Grudic | G16H 50/50 600/371 |
| 2021/0191404 A1* | 6/2021 | Blake | G05D 1/0214 |
| 2021/0302956 A1* | 9/2021 | Sudhakaran | G05D 1/0214 |
| 2023/0016946 A1* | 1/2023 | Wouhaybi | G06F 16/901 |
| 2023/0347924 A1* | 11/2023 | Koehler | B60W 60/001 |

OTHER PUBLICATIONS

Kaiyuan Gao et al., Multi-mobile Robot Autonomous Navigation System for Intelligent Logistics, 2018, [Retrieved on Sep. 9, 2024]. Retrieved from the internet: <URL: https://ieeexplore.ieee.org/stamp/stamp.jsp?tp=&arnumber=8623343> 7 Pages (2603-2609) (Year: 2018).*
Nakkiran, P., Neyshabur, B. and Sedghi, H., 2020. The Deep Bootstrap Framework: Good Online Learners are Good Offline Generalizers. arXiv preprint arXiv:2010.08127.

* cited by examiner

*Primary Examiner* — Anibal Rivera
(74) *Attorney, Agent, or Firm* — Workman Nydegger

(57) ABSTRACT

One example method includes determining a system aggregate drift metric score based on aggregate drift metric scores received from near-edge nodes associated with a central node. The system aggregate drift metric score indicates a level of model drift across a logistics system. The system aggregate drift metric score is compared with a system drift threshold. Current datasets are received from the near-edge nodes when a system aggregate drift metric score is greater than the system drift threshold. A first dataset is generated comprising a joining of the current datasets received from the plurality of near-edge nodes. A second dataset is received from each the near-edge nodes. The first and second datasets are used to select a machine-learning (ML) model to deploy at each of the near-edge nodes.

20 Claims, 13 Drawing Sheets

|     |       |       |     |       |
| --- | ----- | ----- | --- | ----- |
| $M_z$ 430 |       | ⌷ | ⋮ | ⌷ |
| ⋮ | ⋮ | ⋮ | ⋮ | ⋮ |
| $M_2$ 420 | ⌷ | ⌷ | ⋮ | ⌷ |
| $M_1$ 410 | ⌷ | ⌷ | ⋮ |       |
|     | $D_1$ 310 | $D_2$ 320 | ⋮ | $D_z$ 330 |

| $D_{ideal}$ 340 | $M_1$ 410 | $M_2$ 420 | ⋮ | $M_z$ 430 |
|---|---|---|---|---|
| $D_{real}$ 530 | 0.05 | 0.07 | ⋮ | 0.04 |
| Bootstrap Error | 0.07 | 0.13 | ⋮ | 0.14 |
| | 0.02 Keep | 0.06 Keep | ⋮ | 0.10 Discard |

*FIG. 5B*

| $D_{ideal}$ 340 | $M_1$ 410 | $M_2$ 420 | ⋮ | $M_z$ 430 |
|---|---|---|---|---|
| | 257 | 212 | ⋮ | |

BOOTSTRAP METHOD FOR CONTINUOUS DEPLOYMENT IN CROSS-CUSTOMER MODEL MANAGEMENT

FIELD OF THE INVENTION

Embodiments of the present invention generally relate to logistics systems. More particularly, at least some embodiments of the invention relate to systems, hardware, software, computer-readable media, and methods for determining machine-learning (ML) models for near-edge nodes that join the logistics systems.

BACKGROUND

In the logistic space, a prominent edge domain is that of warehouse management and safety, where there are multiple edge-nodes such as forklifts and/or Autonomous Mobile Robots (AMR) having to make decisions in real time. The data collected from forklifts' or AMRs' trajectories at a given entities warehouse can be leveraged into Machine Learning (ML) models to optimize the operation of the forklifts and/or AMRs or to address dangerous operations, via event detection approaches. However, each warehouse operator is unique in handling load and equipment under its unique operational parameters.

A challenge an entity has when implementing a new warehouse is how to quickly train and then test ML models that are able to optimize the operation of the forklifts and/or AMRs that will be operating in the new warehouse. It may take the accumulation of a large dataset from the forklifts and/or AMRs before the ML models can be properly trained and tested. However, it usually requires the forklifts and/or AMRs to operate in a potentially less efficient manner while the datasets are being accumulated.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings.

FIGS. 4A and 4B illustrate the central node of the logistics system of FIG. 2 training and testing ML models using the obtained datasets;

FIGS. 5A-5C illustrate the central node of the logistics system of FIG. 2 automatically selecting a ML model for deployment in a new near-edge node;

DETAILED DESCRIPTION OF SOME EXAMPLE EMBODIMENTS

Figure 1:
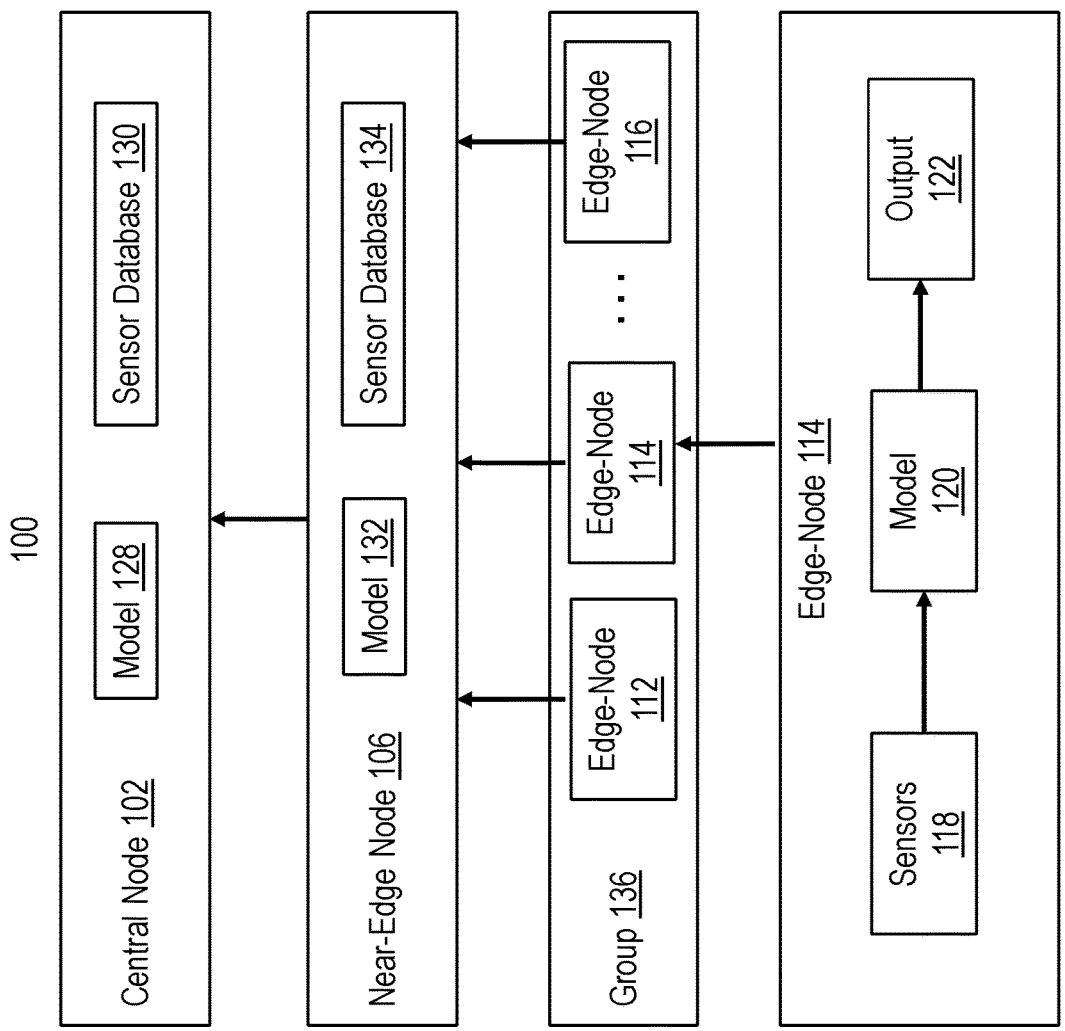
FIG. 1 illustrates an environment in which embodiments of the invention may be deployed or implemented.

Embodiments of the present invention generally relate to logistics systems. More particularly, at least some embodiments of the invention relate to systems, hardware, software, computer-readable media, and methods for determining machine-learning (ML) models for near-edge nodes that join the logistics systems.

In general, example embodiments of the invention provide for an environment where a central node provides compute and storage resources for a number of different customers. In particular, the central node provides training and testing for ML models that are configured to optimize the operation of the forklifts and/or AMRs that are operating in each warehouse of the different customer. This sharing of resources allows the central node to leverage the ML models trained on the group of different customers and their warehouses to be leveraged to help select the best ML model to be provided to new customers who join the shared environment. More concretely, given a new warehouse or customer, the embodiments disclosed herein provide the best possible initial ML model. That is, the ML model, of the ML models that have previously been trained, that is expected to have the best generalization capabilities when dealing with the new customer's/warehouse's data is automatically selected for use by the new customer. This process provides a technical advantage over existing systems as the new customer is able to quickly use the initial ML model for its forklifts and/or AMRs and achieve good results without having to wait for a large dataset to be accumulated before training the ML models as is done in existing systems. Although further training of the initial ML model can subsequently occur, the initial results are much better than would be expected if the new customer had to wait until the large dataset was accumulated, thus providing enhanced reliability to the operation of the warehouse of the new customer.

In operation, it is often the case that a model drift will occur at one or more of the edge-nodes. Such drift may occur when the types of sensor data and/or event data collected by a given edge-node has changed since the ML model was deployed at the given edge-node or when the ML model deployed at the given edge-node begins to function in an unexpected way. This can be a sign that the operational environment of the given edge-node has changed and that the deployed ML model is no longer the best ML model to direct the operation of the edge-nodes. Advantageously, the embodiments disclosed herein provide for model drift monitoring of each edge-node associated with a near-edge node. If a large enough amount of model drift is detected, the embodiments disclosed herein provide for selecting a new ML model to be deployed at the near-edge node and its associated edge-nodes based using the bootstrap error and model convergence discussed previously.

It is also possible for major model drift to occur across multiple near-edge nodes and their associated edge-nodes. Advantageously, the embodiments disclosed herein provide for a process to collect new data to build a new "Ideal World" dataset and then to retrain ML models from scratch using the new Ideal World dataset. Real World data is also collected, and the bootstrap error is used to select the best ML for each near-edge node. Thus, the embodiments disclosed herein provide for a way to correct major model drift in the logistic system.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. For example, any element(s) of any embodiment may be combined with any element(s) of any other embodiment, to define still further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

It is noted that embodiments of the invention, whether claimed or not, cannot be performed, practically or otherwise, in the mind of a human. Accordingly, nothing herein should be construed as teaching or suggesting that any aspect of any embodiment of the invention could or would be performed, practically or otherwise, in the mind of a human. Further, and unless explicitly indicated otherwise herein, the disclosed methods, processes, and operations, are contemplated as being implemented by computing systems that may comprise hardware and/or software. That is, such methods processes, and operations, are defined as being computer-implemented.

A. Aspects of an Example Architecture and Environment

FIG. 1 discloses aspects of an environment in which embodiments of the invention may be deployed or implemented. FIG. 1 illustrates a system (e.g., a logistics system) 100 that includes a central node 102 and a near-edge node 106. The near-edge node 106, for example, may be associated with a specific environment such as a warehouse and may operate with respect to a group 136 of edge-nodes such as the edge-nodes 112, 114, and 116, which also be referred to as far-edge nodes. In other embodiments, the edge-nodes 112, 114, and 116 need not be part of the group 136, but may function without being part of a group.

More specifically, the near-edge node 106 may be associated with a set or group 136 of nodes represented by the edge-nodes 112, 114, and 116. In this example, automated mobile robots (AMR) or forklifts (or the resources thereon) may be examples of the edge-nodes 112, 114, and 116.

The edge-node 114 further may include sensors 118 and a machine-learning (ML) model 120, which generates an inference or an output 122. The ML model 120 may be representative of one or multiple ML models. Each ML model may be able to detect a certain type of event using the same or similar input data from the sensors 118. The data generated by the sensors 118 may be stored as a sensor dataset.

In some examples, the data generated by the sensors 118 is provided to the central node 102, which may also have a copy of the ML model 120, represented as ML model 128. The near-edge node 106 may include a ML model 132 and sensor database 134. The near-edge node 106 may act as the central node 102 in some examples. The sensor database 134 may store sensor data received from all of the edge-nodes 112, 114, 116. Thus, the near-edge node 106 may store sensor data generated by the edge-nodes 112, 114, 116.

The central node 102 may store sensor data generated by the edge-nodes 112, 114, and 116 in the sensor database 130. The sensor database 130 may store the sensor data from the near-edge node 106 and/or other near-edge nodes when present, which may correspond to other environments, and which may be similarly configured. At the edge-node 114, only the recently generated data is generally stored. Local data may be deleted after transmission to the central node 102 and/or to the near-edge node 106. Inferences for a time t are generated using the most recent sensor data.

The central node 102 (e.g., implemented in a near-edge infrastructure or in the cloud) may be configured to communicate with the edge-node 114. The communication may occur via the near-edge node 106. The communication may be performed using radio devices through hardware such as a router or gateway or other devices (e.g., the near-edge node 106). The edge-node 114 may also receive information from the central node 102 and use the information to perform various operations including logistics operations.

The sensors 118 may include position sensors and inertial sensors that generate positional data that determine a position or trajectory of an object in the environment. Positional data can be collected as time series data, which can be analyzed to determine a position of the forklift or AMR, a velocity of the forklift or AMR, a trajectory or direction or travel, a cornering, or the like. The inertial sensors allow acceleration and deceleration to be detected in multiple directions and axes.

In one example, a map of the environment is generated and may be stored at the central node 102 and/or at the near-edge node 106. The system may be configured to map the position data received from the nodes into a map of the environment. The edge-node 114 can determine its own position within the environment. The positions of all nodes (objects) can be determined with respect to each other and with respect to the environment.

The central node 102 may include a ML model 128 and the sensor database 130. The sensor database 130 may include a database for different sensor types. Thus, the sensor database 130 may include a position data database, an inertial database, and the like. In another example, the sensor database 130 may store all sensor data together and/or in a correlated form such that position data can be correlated to inertial data at least with respect to individual nodes and/or in time.

In one example, the local ML model 120 is trained at the central node 102 and deployed to the relevant edge-nodes 112, 114, and 116. The local ML model 120 is trained using available (historical) positioning and/or inertial measurement data (and/or other sensor data, which may include video data). After training, the local ML model 120 may be deployed to the nodes. In one example, the ML models 120 and 128 are the same. One difference is that the local ML model 120 may operate using locally generated data at the edge-node 114 as input while the ML model 128 may use data generated from multiple nodes in the multiple environments as input (e.g., the sensor data in the sensor database 130).

Figure 2:
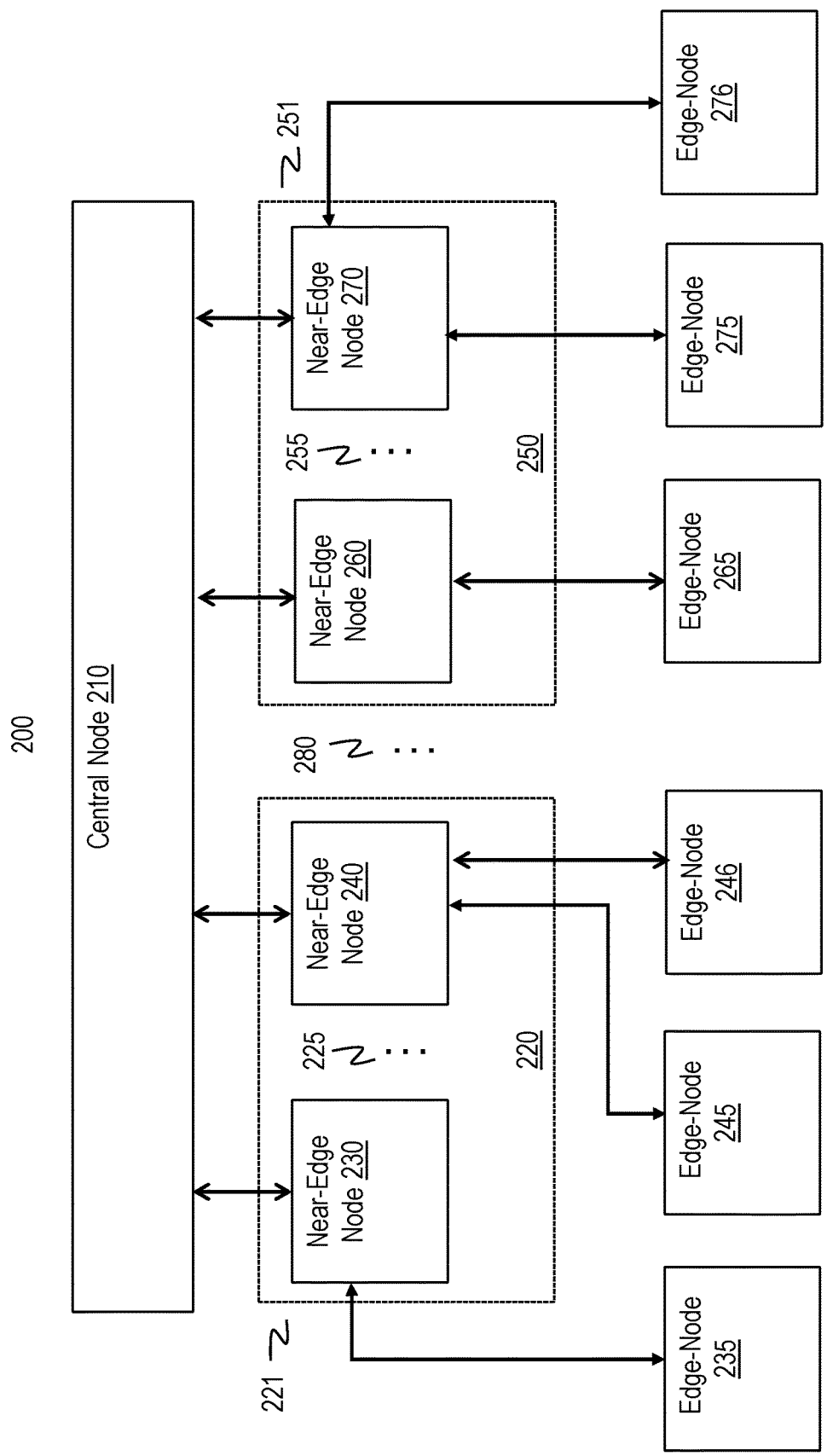
FIG. 2 illustrates a logistics system in which embodiments of the invention may be deployed or implemented.

FIG. 2 discloses aspects of an environment in which embodiments of the invention may be deployed or implemented. FIG. 2 illustrates a logistics system 200 that a central node 210, which may correspond to the central node 102, and near-edge nodes 230, 240, 260, 270 and any number of additional near-edge nodes as illustrated in the figure by the ellipses 280, which all may correspond to the near-edge node 106.

In the embodiment, the central node 210 may represent a large-scale computational environment with appropriate permission and connections to the near-edge nodes 230, 240, 260, 270, and potentially 280. In one embodiment, the central node 210 comprises local infrastructure for a core company or other similar entity to provide federated orchestration services to other organizations that own or otherwise are in control of the near-edge nodes.

For example, in the embodiment of FIG. 2, each near-edge node 230, 240, 260, 270, and 280 may represent a warehouse or other similar logistical environment. As represented by a dashed line 221, the near-edge nodes 230 and 240 may be under the control of an entity 220. As illustrated by the ellipses 225, the entity 220 may also control any number of additional near-edge nodes. Likewise, as represented by a dashed line 251, the near-edge nodes 260 and 270 may be owned or otherwise under the control of an entity 250. As illustrated by the ellipses 255, the entity 220 may also control any number of additional near-edge nodes. The additional near-edge nodes 280 may be under the control of additional entities. The entities 220 and 250 and those entities that control the additional near-edge nodes 280 may be distinct companies, customers, or in partnership with the core company who owns or otherwise controls the central node 210, or alternatively, they may be business units of the core company. FIG. 2 shows that there is separation between the near-edge nodes of the different entities to ensure security and privacy when implementing the embodiments disclosed herein.

Each of the near-edge nodes 230, 240, 260, 270, and 280 is associated with one or more edge-nodes, which may correspond to the edge-nodes 112, 114, and 116 and thus may include the various sensors and ML models previously described. For example, the near-edge node 230 is associated with the edge-node 235, the near-edge node 240 is associated with the edge-nodes 245 and 246, the near-edge node 260 is associated with the edge-node 265, and the near-edge node 270 is associated with the edge-nodes 275 and 276. The additional near-edge nodes 280 may also be associated with any number of edge-nodes. It will be appreciated that in practice that each near-edge node may be associated with many edge-nodes and thus the edge-nodes that are shown are for ease of illustration only. The logistics system 200 may be used to implement the embodiments disclosed herein as will be explained in more detail to follow.

B. Aspects of Deep Bootstrap Framework

In this section, a discussion is made of explaining the idea of a Deep Bootstrap Framework to access generalization of ML models. In the Deep Bootstrap Framework, generalization is seen slightly different, as a modification on the classical view. In the classical view on generalization, equation 1 is often used:

$$\text{Test Error}(f_t) = \text{Train Error}(f_t) + [\text{Test Error}(f_t) - \text{Train Error}(f_t)] \quad \text{Equation 1}$$

where [Test Error($f_t$)–TrainError($f_t$)] is the generalization gap and ($f_t$) is a deep neural network after t optimization steps. There are two issues with this view: (1) Modern methods reach TrainError≈0 while still performing well, thus, this equation reduces to analyzing Test Error; and (2) most techniques for understanding the generalization gap either remain vacuous or non-predictive.

The Deep Bootstrap Framework uses equation 2 to access generalization of ML models:

$$\text{Test Error}(f_t) = \text{Train Error}(f_t^{iid}) + [\text{Test Error}(f_t) - \text{Train Error}(f_t^{iid})] \quad \text{Equation 2}$$

with $f_t^{iid}$ having the same training as $f_t$ but trained on fresh samples at each mini-batch. That is, $f_t^{iid}$ optimizes what is called the population loss, while $f_t$ optimizes the empirical loss.

The Deep Bootstrap Framework is further conceptualized by introducing what is referred to as the "Real World" and "Ideal World". The Real World is where the ML model is trained while seeing the same sample more than once. In the Ideal World, the ML model never sees the same sample more than once (in the limit, it is training on an infinite data regime). The training done in the Real World is also called offline learning and the training done in the Ideal World is also called online learning.

The Deep Bootstrap Framework looks at two things: (1) how quickly ML models optimize in the Ideal World (infinite data regime), and (2) how close are the ML models in Ideal World versus Real World: referred to as "the bootstrap error". The bootstrap error is given by [Test Error($f_t$)–TrainError($f_t^{iid}$)].

The Deep Bootstrap Framework provides the following insights: (1) the generalization of ML models in offline learning is largely determined by their optimization speed in online learning, (2) the same techniques (architectures and training methods) are used in practice in both over- and under-parameterized regimes, and (3) instead of directly trying to characterize which empirical minima SGD reaches, it may be sufficient to study why SGD optimizes quickly on the population loss. Finally, in the Deep Bootstrap Framework the Ideal World can be represented by a very large dataset that generally ensures that the same samples are never seen twice.

C. Framework for Determining a ML Model to Deploy

The embodiments disclosed herein provide for a new framework for identifying the best ML model architecture for a new entity/warehouse joining the logistics system 200, where the logistics system 200 may be implemented as a Machine Learning as a service environment. In particular, the embodiments disclosed herein focus on the domain of event detection of AMRs and forklifts as edge-nodes when the near-edge nodes are warehouses or other similar logistics environments.

The new framework leverages the Deep Bootstrap Framework discussed above, but adds additional features to the Deep Bootstrap Framework. In the embodiments, the error of the target ML model (i.e., the generalization error) can be estimated using the error of a pre-trained ML model's metadata. The error of each one of the pre-trained ML models are an "Ideal World" scenario since they are trained on a very large amount of data collected from many AMRs and forklifts as edge-nodes operating at many different warehouses as near-edge nodes. On the other hand, the data collected from the new entity's warehouse represents the "Real World" scenario. Thus, the embodiments disclosed herein determine the ML model architecture that minimizes the difference between the decay of the loss between the pre-trained and new ML models.

The framework of the embodiments disclosed herein has two stages: pre-Ideal World and post-Ideal World, both of which will be explained in more detail to follow. In the pre-Ideal World stage data is accumulated at the central node so as to reach an Ideal World scenario. In this stage, training is still performed on the ML models, but without using any bootstrap method. In the post-Ideal World, enough data is accumulated at the central node to consider it an Ideal World and ML models are considered for deployment using the bootstrap method.

C1. Pre-Ideal World

Figure 3:
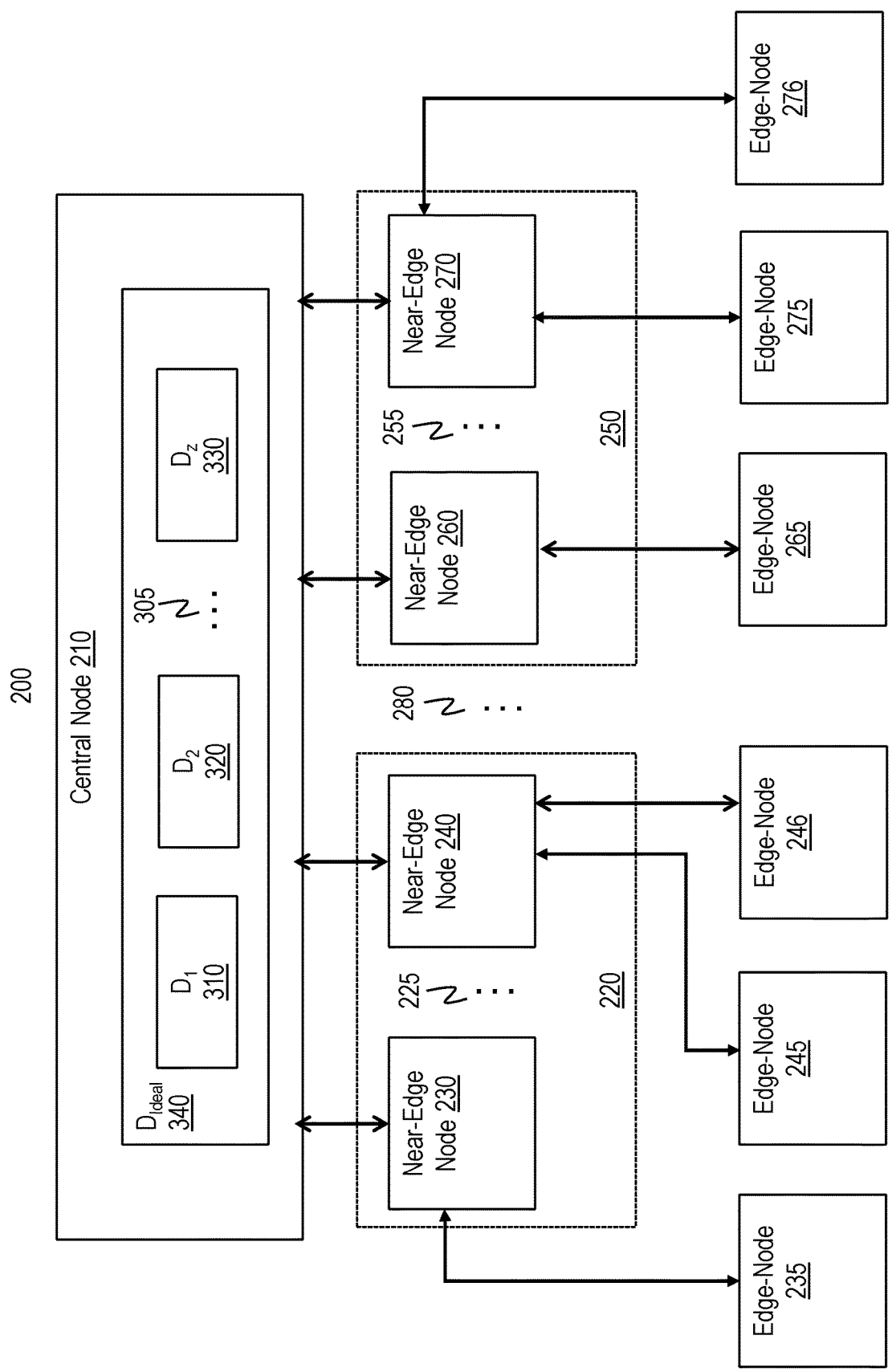
FIG. 3 illustrates a central node of the logistics system of FIG. 2 obtaining datasets from near-edge nodes.

FIG. 3 illustrates an embodiment of the logistics system 200 operating during an accumulation phase of the pre-Ideal World stage. As illustrated in FIG. 3, during the accumulation phase, the near-edge nodes 230, 240, 260, 270, and 280 perform the gathering of various datasets of sensor and event data from each of the edge-nodes that are associated with each near-edge node. The gathered datasets are then provided by the near-edge nodes to the central node 210. For example, each near-edge node may collect and then provide a dataset $D_1$ denoted at 310, a dataset $D_2$ denoted at 320, and as illustrated by the ellipses 305, up to a dataset $D_z$ denoted at 330 to the central node 210. In other words, the process of collecting and providing the datasets to the central node 210 is an iterative process where whenever new datasets are obtained from the edge-nodes, the new datasets are collected by the near-edge nodes and provided to the central node 210.

The various datasets are then accumulated by the central node 210 into a dataset $D_{Ideal}$, which is denoted at 340 and that comprises the joining of the datasets $D_1$ 310, $D_2$ 320, . . . , $D_z$ 330 obtained from the near-edge nodes. The purpose of the iterative process is to is to obtain an approximation of an infinite "Ideal World" dataset by obtaining a sufficiently large enough dataset where no two samples are likely to been seen twice during ML model training. Thus, the iterative process shown in FIG. 3 should be continuous so that that a large enough dataset can be obtained. Given that there will typically be a large number of entities and their related near-edge nodes associated with the central node 210, the iterative process is unlikely to be burdensome to the entities 220, 250, and any entities that control the near-edge nodes 280.

Figure 4A:
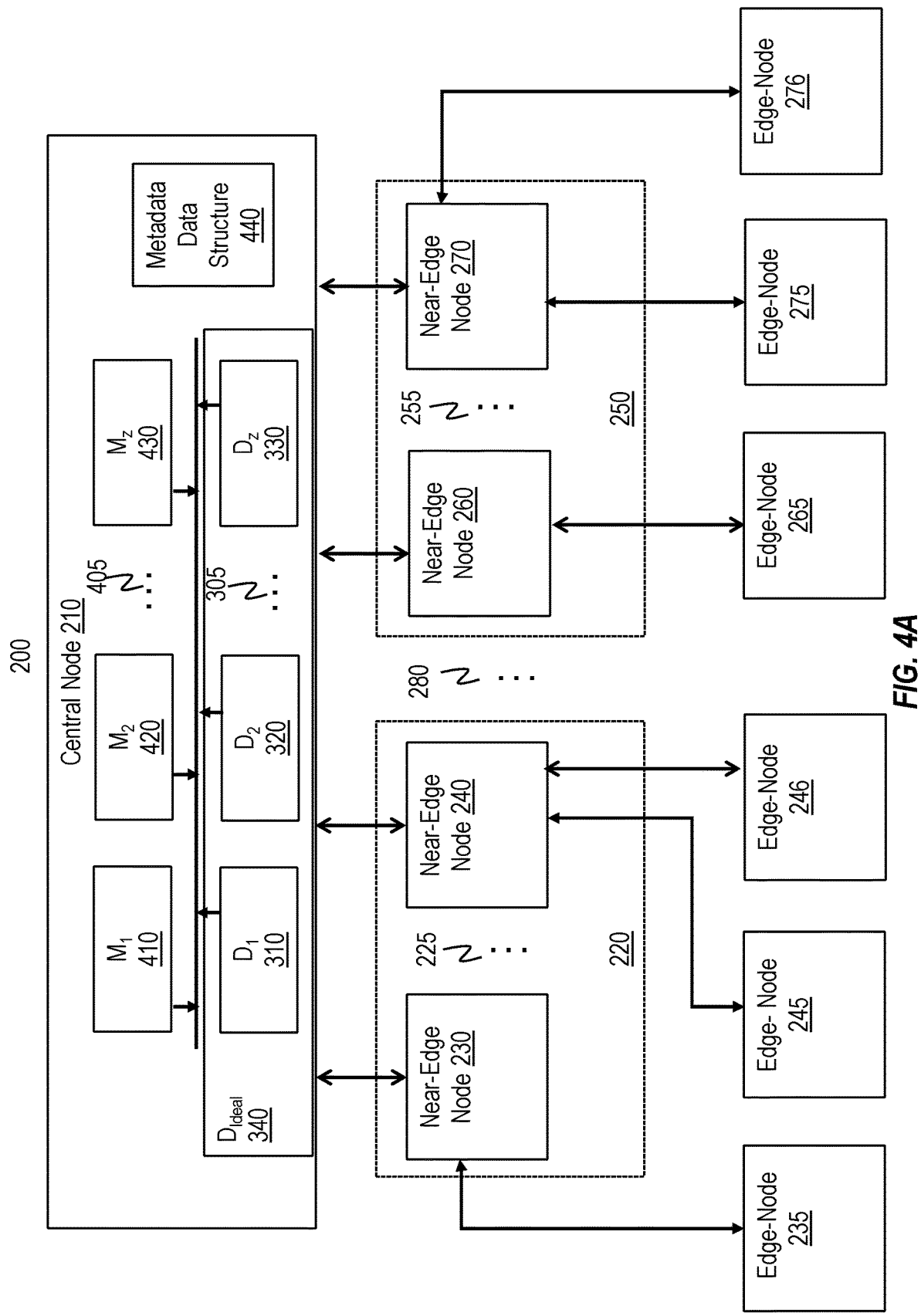

FIG. 4A illustrates an embodiment of the logistics system 200 operating during the pre-Ideal World stage as the system accumulates and trains various ML models for use at near-edge nodes and their associated edge-nodes. As shown in FIG. 4A, the central node obtains various ML models for training. As illustrated, the ML models include a ML model $M_1$ denoted at 410, a ML model $M_2$ denoted at 420, and as illustrated by the ellipses 405, up to a ML model $M_z$ denoted at 430.

The initial ML model architectures for the ML models $M_1$ 410, $M_2$ 420, . . . , $M_z$ 430 can be obtained by various methods known to those of skill in the art and may be domain-dependent. For example, these ML model architectures may be adapted from similar domains, if applicable, or defined and chosen by domain experts skilled in the art. Different methods for obtaining an initial set of ML model architectures may apply.

The central node 210 then proceeds to train all of the ML models $M_1$ 410, $M_2$ 420, . . . , $M_z$ 430 using the datasets $D_1$ 310, $D_2$ 320, . . . , $D_z$ 330 obtained from the near-edge nodes. It will be noted that because the central node 210 may not yet have accumulated a large enough dataset $D_{Ideal}$ 340 to approximate the "Ideal World", the central node 210 does not wait to begin training the ML models, but instead uses the datasets $D_1$ 310, $D_2$ 320, . . . , $D_z$ 330 that have been obtained up to that time.

As illustrated in FIG. 4A, the central node 210 includes metadata data structure 440. The metadata data structure 440, in some embodiments, may be an indexing data structure where training and testing metadata for a given near-edge and ML model architecture are stored and retrievable.

This metadata can be leveraged for active ML model management. For example, the metadata associating datasets and ML models can be considered to perform the tentative deployment of ML models to entities that newly join the logistics system 200, choosing the ML models that are most-generalized. Thus, the deployment of the most-generalized ML model to the new entries may take place even before the approximation for the Ideal World is obtained.

The determination of a most-generalized ML model from a set of ML models such as ML models $M_1$ 410, $M_2$ 420, . . . , $M_z$ 430 will consider the performance achieved by the resulting ML model of that architecture when trained with one or more datasets or combinations of datasets $D_1$ 310, $D_2$ 320, . . . , $D_z$ 330. The most-appropriate method for determining the most-generalized ML model may vary depending on the domain and on the nature of the datasets. Thus, any reasonable method may be used for making this determination.

In one embodiment, a method for determining the most-generalized ML model could be determining the ML model architecture with a good enough performance above a parametrized threshold t for a maximum number of datasets $D_1$ 310, $D_2$ 320, . . . , $D_z$ 330. Such an embodiment is shown in FIG. 4B, which also illustrates an embodiment of the metadata data structure 440.

Figure 4B:
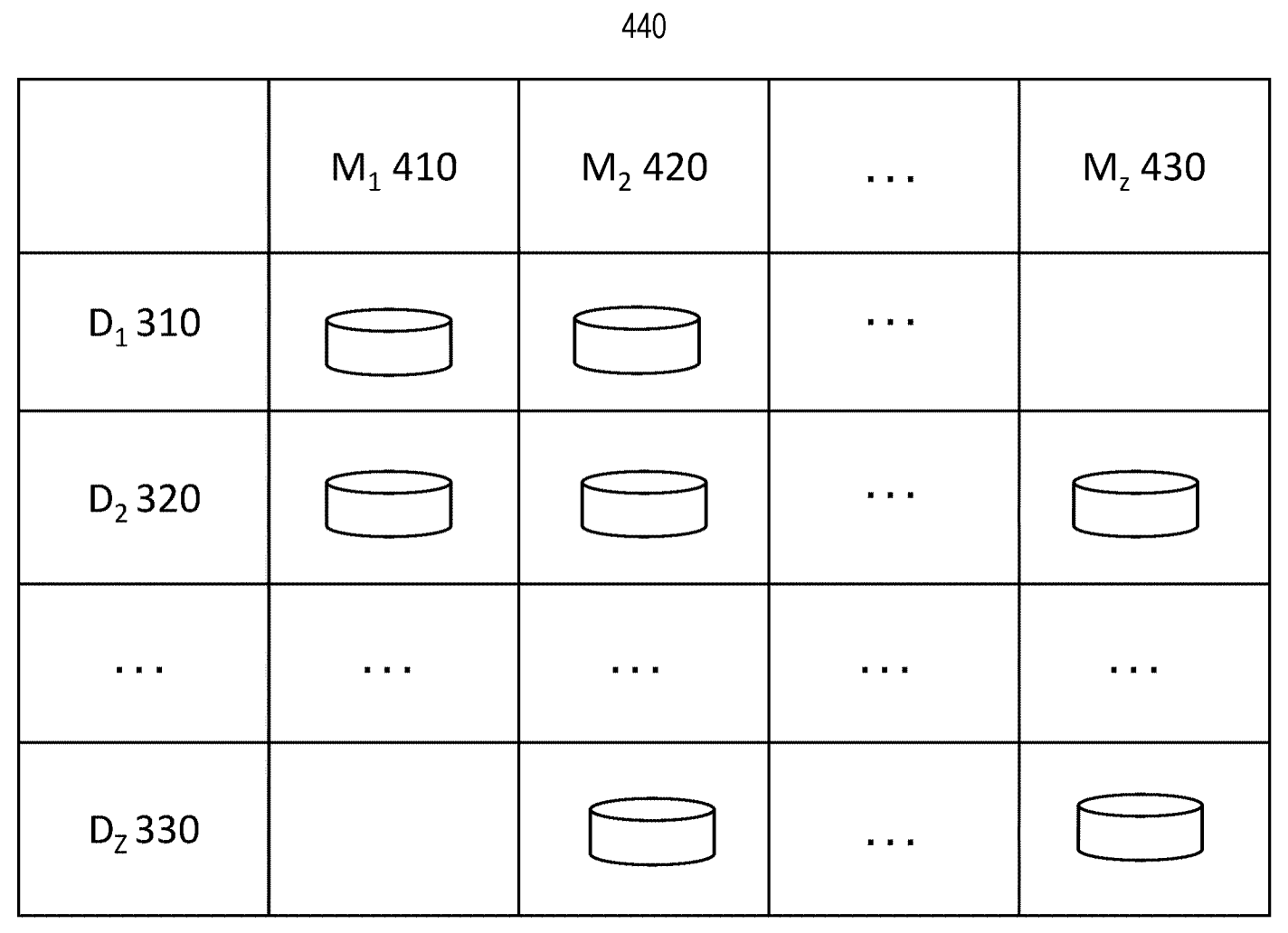

As shown in FIG. 4B, the indications in the metadata structure shown represent that an ML model $M_i$, when trained and tested with dataset $D_j$, achieves an accuracy above a predetermined threshold t. For example, when the ML model $M_1$ 410 is trained and tested using the datasets $D_1$ 310 and $D_2$ 320, the ML model architecture achieves an accuracy above the predetermined threshold t and an indication is made in the metadata data structure 440. However, when the ML model $M_1$ 410 is trained and tested using the dataset $D_z$ 330, the ML model architecture does not achieve an accuracy above the predetermined threshold t and so no indication is made in the metadata data structure 440. Likewise, when the ML model $M_2$ 420 is trained and tested using the datasets $D_1$ 310, $D_2$ 320, . . . , $D_z$ 330, the ML model architecture achieves an accuracy above the predetermined threshold t and an indication is made in the metadata data structure 440. Further, when the ML model $M_z$ 430 is trained and testes using the datasets $D_2$ 320 and $D_z$ 330, the ML model architecture achieves an accuracy above the predetermined threshold t and an indication is made in the metadata data structure 440. However, when the ML model $M_z$ 430 is trained and tested using the dataset $D_1$ 310, the ML model architecture does not achieve an accuracy above the predetermined threshold t and so no indication is made in the metadata data structure 440. Accordingly, in this embodiment the most-generalized ML model would be ML model $M_2$ 420 as its architecture achieves reasonable performance for a majority of the ML models.

Alternative methods may also be applied. A method may alternatively consider a pondered weighted value for each dataset, depending on the number of samples or on a distribution of the data (instead of only considering if it is above or below a threshold). Another alternative still may consider, for example, the level of accuracy and/or generalization achieved by a ML model architecture trained with a dataset but tested in other datasets. Also, if some datasets from the near-edge nodes of the new entity are available, the method for determining the most-generalized ML model may leverage a comparison of the distribution of those datasets with the distributions of the known datasets, favoring ML model architectures that perform best for datasets with a more similar distribution. It will be appreciated that combinations of the above discussed methods may also apply.

Hence, prior to obtaining a large enough dataset to be considered an Ideal World, the logistics system 200 is still able to accumulate datasets, train ML model architectures, expand the known ML model architectures, and tentatively select a most-generalized ML model architecture for the near-edge nodes of the new entities.

C2. Post Ideal World

The logistics system 200 enters the post-Ideal World phase once the central node 210 has accumulated enough datasets from the near-edge nodes 230, 240, 260, 270, and 280 to generate the dataset $D_{Ideal}$ 340 to approximate the "Ideal World". In this phase, the central node 210 is able to leverage the Deep Bootstrap Framework to enhance the determination of which ML model would be the best for a new entity to use. It will be noted that in this phase, the central node 210 and the various near-edge nodes do not necessarily stop gathering datasets. However, it will be appreciated that the dataset $D_{Ideal}$ 340 will include the minimum amount of data that is needed to consider dataset $D_{Ideal}$ 340 an Ideal World dataset.

Figure 5A:
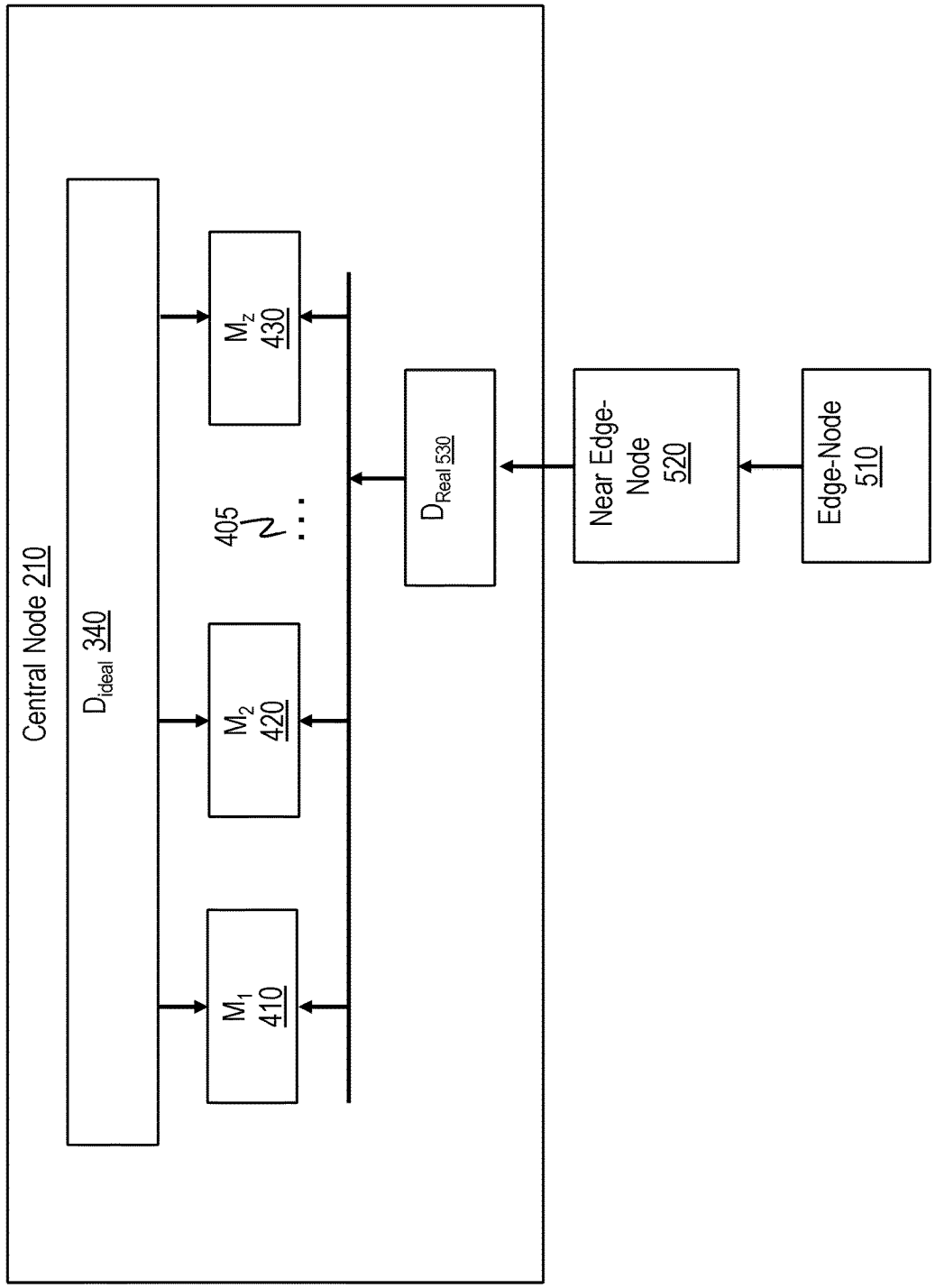

FIG. 4A illustrates an embodiment of the logistics system 200 operating during the post-Ideal World phase. It will be noted that for ease of illustration, not all the elements of the logistics system 200 are shown in FIG. 5A. In post-Ideal World phase, the first step is to train all stored ML models $M_1$ 410, $M_2$ 420, ..., $M_z$ 430 using the dataset $D_{Ideal}$ 340. In addition to storing metadata related to timestamps and ML model architecture versions, the central node 210 stores information on the training loss and validation loss curves for each of the ML models $M_1$ 410, $M_2$ 420, ..., $M_z$ 430 trained using the dataset $D_{Ideal}$ 340.

As shown in FIG. 5A, a new near-edge node 520 that requires a new ML model has joined the logistics system 200. The new near-edge node 520, which may correspond to the previously described near-edge nodes, receives sensor and event data from an edge-node 510, which may correspond to the previously described edge-nodes. Rather than make the near-edge node 520 wait until it has enough datasets to determine and train a ML model, the embodiments disclosed herein leverage the ML models known to the system to select a ML model that is likely the best for the near-edge node based on the type of sensor and event data being received by the near-edge node 520 from the edge-node 510. The selected ML model can then be at least initially used by the near-edge node 520 to control the operations of the edge-nodes 510.

The near-edge node 520 provides various datasets that comprise the sensor and event data from the edge-node 510 to the central node 210. The central node 210 may start indexing the datasets provided by the near-edge node 520 until a satisfactory dataset size is accumulated as a dataset $D_{Real}$ denoted at 530. It will be appreciated that the dataset $D_{Real}$ 530 will typically be smaller than the dataset $D_{Ideal}$ 340 since the dataset is generated from a much smaller number of near-edge nodes. The central node 210 may then train the ML models $M_1$ 410, $M_2$ 420, ..., $M_z$ 430 using the dataset $D_{Real}$ 530.

Accordingly, the central node 210 trains the ML models $M_1$ 410, $M_2$ 420, ..., $M_z$ 430 using the dataset $D_{Ideal}$ 340 (the Ideal World) and using the dataset $D_{Real}$ 530 (the Real World). It is then possible for the central node 210 to compare the bootstrap error and process a training loss curve of each ML model $M_1$ 410, $M_2$ 420, ..., $M_z$ 430 on the Ideal World and on the Real World to determine the best ML model for the near-edge node 520. When determining the best ML model for the near-edge node 520, the central node 210 considers (1) which ML models have a bootstrap error less than a small epsilon and (2) which ML model has the fastest Ideal World convergence.

The bootstrap error is calculated in relation to a triple: $(D_i, D_r, M_j)$: an Ideal World dataset $D_i$, a Real World dataset $D_r$, and a model $M_j$. The ML model should have been trained and tested on both the Ideal and Real Worlds. The central node 210 then looks at two quantities:

$$D_{i M_j}^{Test} \text{ and } D_{r M_j}^{Test},$$

respectively the test error of model $M_i$ trained and tested using the Ideal World dataset, and respectively the test error of model $M_i$ trained and tested using the Real World dataset. The bootstrap error for $(D_i, D_r, M_j)$ is:

$$BE_{M_j}^{D_i D_r} = D_{r M_j}^{Test} - D_{i M_j}^{Test} \quad \text{Equation 3}$$

In the embodiment, $BE_{M_j}^{D_i D_r}$ should be small for a ML model to be considered a good candidate. Therefore, the central node 210 sets a threshold $BE_{M_j}^{D_i D_r} \leq \epsilon$; if a ML model architecture $M_j$ has $BE_{M_j}^{D_i D_r} > \epsilon$, it is discarded. The central node 210 the considers all non-discarded ML model architectures to evaluate their training loss curve on the Ideal World. The central node 210 defines a measure of convergence as the epoch at which a ML model architecture achieved at least 101% of its minimum training loss. Finally, the central node 210 automatically chooses or selects the ML model architecture with the smallest convergence epoch as the best candidate to deploy to the near-edge node 520.

Thus, there are two main steps when processing the joining near-edge node 520: (1) calculating the bootstrap error for each ML model $M_1$ 410, $M_2$ 420, ..., $M_z$ 430, and (2) calculating the convergence cycle for each ML model $M_1$ 410, $M_2$ 420, ..., $M_z$ 430 on the Ideal World. FIG. 5B illustrates an embodiment of calculating the bootstrap error for each ML model $M_1$ 410, $M_2$ 420, . . . , $M_z$ 430. As discussed above when the bootstrap error for a given ML model is above the threshold ϵ, the ML model is discarded, and the second step is not taken for that ML model. In the embodiment of FIG. 5B, suppose the threshold ϵ is set to be 0.08 for purposes of explanation.

As illustrated in FIG. 5B, a test error for each ML model $M_1$ 410, $M_2$ 420, . . . , $M_z$ 430 is calculated using both the dataset $D_{Ideal}$ 340 and the dataset $D_{Real}$ 530. As shown in the figure, the test error for the ML model $M_1$ 410 calculated using dataset $D_{Ideal}$ 340 is 0.05 and calculated using dataset $D_{Real}$ 530 is 0.07. The bootstrap error is then calculated to be 0.02 by taking the difference between test errors. Likewise, the test error for the ML model $M_2$ 420 calculated using dataset $D_{Ideal}$ 340 is 0.07 and calculated using dataset $D_{Real}$ 530 is 0.13. The bootstrap error is then calculated to be 0.06 by taking the difference between test errors. Since the calculated bootstrap error is less than the threshold ϵ of 0.08, both the ML models $M_1$ 410 and $M_2$ 420 are not discarded and will move to the next step.

As also shown in FIG. 5B, the test error for the ML model $M_z$ 430 calculated using dataset $D_{Ideal}$ 340 is 0.04 and calculated using dataset $D_{Real}$ 530 is 0.14. The bootstrap error is then calculated to be 0.10 by taking the difference between test errors. Since the calculated bootstrap error is more than the threshold ϵ of 0.08, the ML model $M_z$ 430 is discarded and does not move onto the next step. That is, since the bootstrap error is more than the threshold, the ML model $M_z$ 430 is not likely to perform well using the datasets of the near-edge node 520. Thus, the bootstrap error acts as a qualifying criterion that filters out any ML models who have an architecture that is not configured for the types of datasets of the near-edge node 520.

FIG. 5C illustrates the calculation of the convergence cycle using dataset $D_{Ideal}$ 340 of those ML models who bootstrap error was less than the threshold ϵ. The convergence cycle calculation evaluates a training loss curve for each ML model and then determines the epoch at which all non-discarded ML models achieved at least 101% of its minimum training loss based on the training loss curve. As shown in FIG. 5C, the calculation of the convergence cycle of the ML model $M_1$ 410 is 257 and the calculation of the convergence cycle of the ML model $M_2$ 420 is 212. Since the ML model $M_z$ 430 was discarded, a convergence cycle calculation is not performed for this ML model, and it is left blank in FIG. 5C for illustration purposes. Accordingly, the ML model $M_2$ 420 has the smallest convergence epoch and thus is determined to be the best ML model to deploy at the near-edge node 520.

It will be noted that the ML model $M_2$ 420 had a larger bootstrap error than the ML model $M_1$ 410. However, once the bootstrap errors have been determined and the ML models who have bad performance are discarded, the convergence cycle calculation becomes the deciding factor. Thus, the convergence cycle calculation acts as a ranking criterion, with the smallest convergence epoch belonging to the ML model that is likely to have the best performance for the datasets of the near-edge node 520.

In some embodiment, the calculation of the convergence cycle for each ML model on the Ideal World can be pre-calculated for every known ML model architecture. It is also possible to pre-calculate the test error of each known ML model architecture on the Ideal World dataset. Then, when the near-edge node 520 joins the logistics system 200, the central node 210 only needs to calculate the test error on the Real World dataset for every known ML model architecture. It is then possible to perform the steps described above to find the best ML model architecture for the near-edge node 520. This approach may advantageously speed up the determination process as less computation resources will be needed at the time the near-edge node 520 joins since all the Ideal World calculations have previously been performed.

D. Drift Monitoring

In operation, it often the case that a model drift will occur at one or more of the edge-nodes. Such drift may occur when the types of sensor data and/or event data collected by a given edge-node 235, 245, 246, 265, 275, and 276 has changed since the ML model being deployed at the given edge-node or when the ML model deployed at the given edge-node begins to function in an unexpected way. This can be a sign that the operational environment of the given edge-node has changed and that the deployed ML model is no longer the best ML model to direct the operation of the edge-nodes. Advantageously, the embodiments disclosed herein provide for model drift monitoring of each edge-node associated with a near-edge node. If a large enough amount of model drift is detected, the embodiments disclosed herein provide for selecting a new ML model to be deployed at the near-edge node and its associated edge-nodes based using the bootstrap error and model convergence discussed previously. This process will now be explained.

Figure 6A:
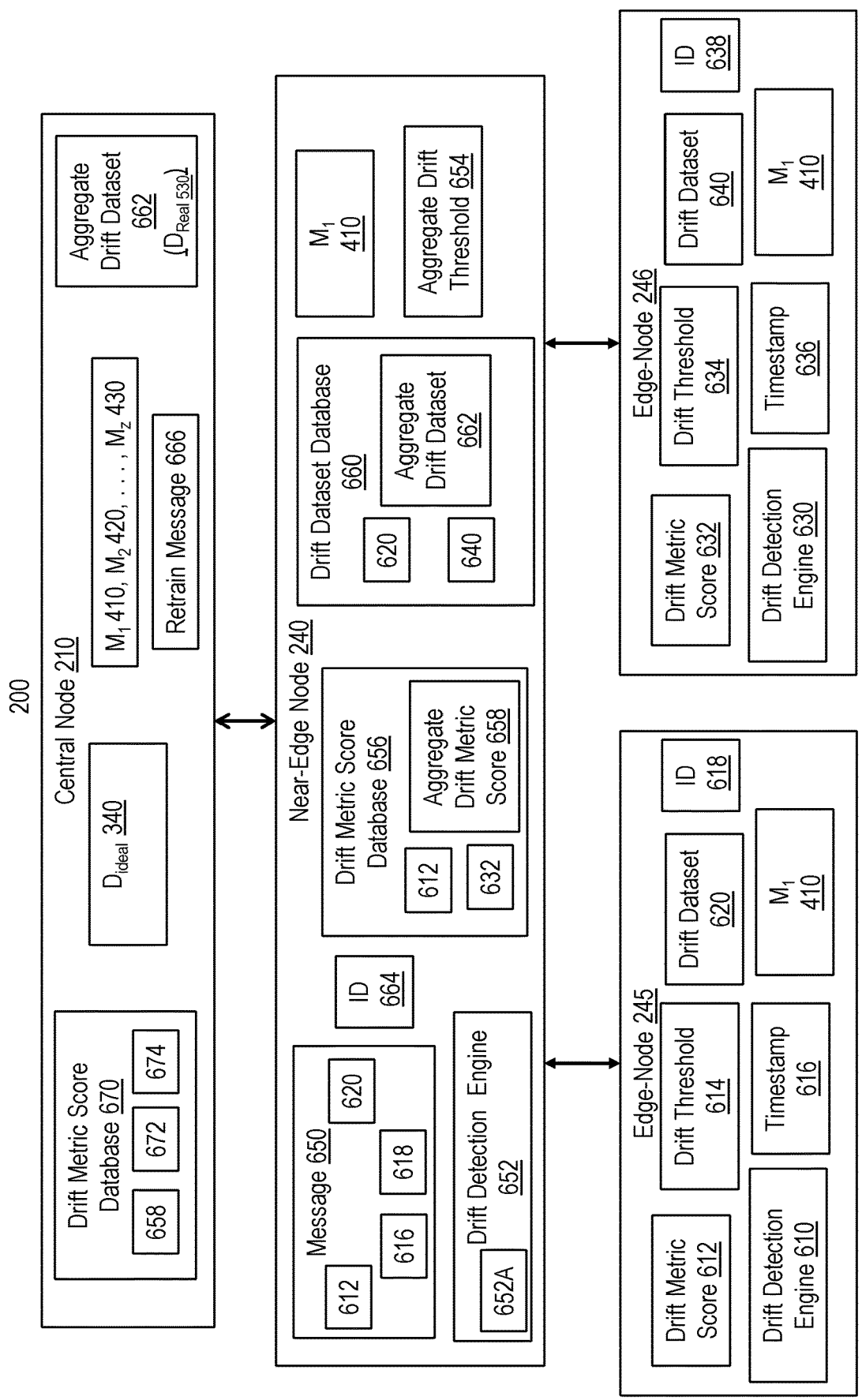
FIGS. 6A and 6B illustrate the central node of the logistics system of FIG. 2 automatically selecting a ML model based on model drift monitoring.

FIG. 6A illustrates an embodiment of the logistics system 200, which for ease of illustration only shows some of the elements of the previously described embodiments. Thus, FIG. 6A illustrates the central node 210, the near-edge node 240, and the edge-nodes 245 and 246. It will be appreciated that the discussion related to the near-edge node 240 and the edge-nodes 245 and 246 may apply to the other near-edge nodes and their associated edge-nodes of the logistics system 200.

In the embodiment of FIG. 6A, the logistics system 200 is operating during what is previously referred to as the post-Ideal World. Accordingly, the central node 210 has selected the ML model $M_1$ 410 to be deployed at the near-edge node 240, which is turn has deployed the ML model $M_1$ 410 to the edge-nodes 245 and 246. The edge-nodes 245 and 246 assimilates sensor and event data into a dataset on which to run inference for the ML model $M_1$ 410. The output of the ML model $M_1$ 410 is used to direct the operation of the edge-nodes 245 and 246.

As mentioned previously, it is possible that model drift of the ML model $M_1$ 410 may occur at one or both of the edge-nodes 245 and 246. Accordingly, the edge-node 245 includes a drift detection engine 610 and the edge-node 246 includes a drift detection engine 630. In operation, the drift detection engine 610 and the drift detection engine 630 are configured to monitor the output of the ML model $M_1$ 410 for possible model drift. In one embodiment, the drift detection engine 610 and the drift detection engine 630 compare the output of ML model $M_1$ 410 with expected output or labeled datasets. In other embodiments, the drift detection engine 610 and the drift detection engine 630 may implement other detection methods. Accordingly, the embodiments disclosed herein are not limited by the type of detection method implemented by the drift detection engine 610 and the drift detection engine 630.

Based on the model drift monitoring, the drift detection engine 610 and the drift detection engine 630 generate a drift metric score 612 and a drift metric score 632, which are a measure of the amount of model drift that was detected by the drift detection engines. The drift metric scores 612 and 632 are then periodically sent to the near-edge node 240, where they are stored in a drift metric score database 656 at the near-edge node 240. In some embodiments, the drift metric scores 612 and 632 are sent to the near-edge nodes according to a pre-defined time interval. The pre-defined time interval may be determined based on how often the drift detection engine 610 and the drift detection engine 630 are configured to generate their respective drift metric scores. Thus, the drift detection engine 610 and the drift detection engine 630 may report their respective drift metric scores every time they are generated. Alternatively, the drift metric scores may be stored at the edge-node and only reported after a pre-determined amount of the time to thus save on communication resources in the logistics system 200. How often the drift metric scores are sent to the near-edge node 240 may also be dependent on the storage and computational resources available to the edge-nodes 245 and 246.

As illustrated, the near edge-node 245 includes a pre-defined drift threshold 614. The drift threshold 614 specify a level at which model drift is likely occurring. Accordingly, in operation the drift detection engine 610 compares the drift metric score 612 to the drift threshold 614. When the drift metric score 612 is equal to or larger than the drift threshold 614, the drift detection engine 610 determines that model drift is occurring and sends a drift dataset 620 to the near-edge node 240. The drift dataset 620 includes the sensor and event data that is collected by the edge-node 245 during the time-interval since the last drift metric score was sent to the near-edge node 240. Thus, when the drift metric score 612 is below the drift threshold 614, only the current drift metric score is sent and when the drift metric score 612 is above the drift threshold 614, the drift dataset 620 is also sent.

In some embodiments, the edge-node 245 may send a message 650 to the near-edge node 240. The message 650 includes the current drift metric score 612 and the drift dataset 620. In addition, the message 650 may also include a timestamp 616 that specifies the time interval during which the drift dataset 620 was collected. In addition, an ID 618 for the edge-node 245 may also be included. The ID 618 is used by the near-edge node and possible the central node 210 to identify the drift dataset 620 as belonging to the edge-node 245. The drift dataset 620 is stored in a dataset database 660 at the near-edge node 240.

In like manner, the edge-node 246 includes a pre-defined drift threshold 634 that specifies a level at which model drift is likely occurring. Accordingly, in operation the drift detection engine 630 compares the drift metric score 632 to the drift threshold 634. When the drift metric score 632 is equal to or larger than the drift threshold 634, the drift detection engine 630 determines that model drift is occurring and sends a drift dataset 640 to the near-edge node 240. The drift dataset 640 includes the sensor and event data that is collected by the edge-node 246 during the time-interval since the last drift metric score was sent to the near-edge node 240. Thus, when the drift metric score 632 is below the drift threshold 634, only the current drift metric score is sent and when the drift metric score 632 is above the drift threshold 634, the drift dataset 640 is also sent. Although not illustrated, the drift metric score 632 and the drift dataset 640 may be sent in a message corresponding to the message 650 and that also includes a timestamp 636 and an ID 638 for the edge-node 246. The operation of the timestamp 636 and the an ID 638 correspond to the operation of the timestamp 616 and the ID 618. The drift dataset 640 is stored in the dataset database 660 at the near-edge node 240.

In some embodiments, the edge-nodes 245 and 246 may also send a dataset of sensor and event data to the near-edge node 240 according to a pre-defined time schedule without regard to the drift metric score and drift threshold. This may be done because the edge-node does not have enough storage resources to locally store datasets. The pre-defined time schedule may correspond to the pre-determined time interval for the drift metric score reporting. In some embodiments, this periodic sending of datasets to the near-edge node 240 may occur in addition to the sending of the drift datasets 620 and 640 previously described.

However, in other embodiments, the edge-nodes 245 and/or 246 may not include a drift detection engine and thus are not able to monitor for model drift or to generate a drift metric. Accordingly, the near-edge node 240 includes a drift detection engine 652 and a drift threshold 652A. The drift detection engine 652 monitors the incoming datasets received from the edge-nodes 245 and 246 that have not been monitored for model drift, either because the dataset is sent according to the pre-determined time schedule or because the edge-node does not include a local drift detection engine. The drift detection engine 652 then generates a drift metric score based on its monitoring and these drift metric scores are stored in the drift metric score database. For ease of illustration, and because the drift metric scores are generated based on datasets received from the edge-nodes 245 and 246, the drift metric scores generated by the drift detection engine 652 are also referred to as drift metric scores 612 and 632.

The drift detection engine 652 also compares the drift metric scores it has generated with the drift threshold 652A. When the drift metric score is larger than the drift threshold 652A, the drift detection engine 652 determines that model drift occurring. The datasets received from the edge-nodes 245 and 246 are then stored in the drift dataset database 660. For ease of illustration, and because the datasets are received from the edge-nodes 245 and 246, these datasets are also referred to as drift datasets 620 and 640.

In operation, the near-edge node 240 is configured to periodically check for an overall or aggregate model drift for the combinations of all edge-nodes that are associated with it. That is, in some scenarios it is possible that that the edge-node 245 is experiencing model drift, but the edge-node 246 and any other non-illustrated edge-node associated with the near-edge node 240 are not experiencing model drift. In such scenario, the overall or aggregate model drift may not be enough for the near-edge node to take any action. However, if the overall or aggregate model drift becomes high enough, then the near-edge node 240 may take action to preserve good system performance.

Accordingly, the drift detection engine 652 is configured to generate an aggregate drift metric score 658 from the received drift metric scores 612 and 632 and any drift metric scores from any other non-illustrated edge-node associated with the near-edge node 240. In one embodiment, the aggregate drift metric score 658 may be calculated as a simple mean or median of the overall drift metric scores from all the edge-nodes associated with the near-edge node 240. However, in other embodiments other calculations can be used and thus the embodiments disclosed herein are not limited to any specific type of calculation for the aggregate drift metric score 658. The aggregate drift metric score 658 is then reported to the central node 210, where it is stored in a drift metric database 670, along with other aggregate drift metrics scores 672 and 674 that are received from other near-edge nodes such as near-edge nodes 230 and 260.

The drift detection engine 652 then compares the aggregate drift metric score 658 against an aggregate drift metric threshold 654. The aggregate drift metric threshold 654 specifies a level at which model drift is likely occurring in all the edge-nodes associated with the near-edge node 240. When the aggregate drift metric score 658 is less than the aggregate drift metric threshold 654, the aggregate drift metric score 658 is reported to the central node 210. However, when the aggregate drift metric score 658 is equal to or higher than the aggregate drift metric threshold 654, drift detection engine 652 may determine that enough model drift has occurred that the ML model $M_1$ 410 is no longer able to properly control or direct the operation of the edge-nodes 245, 246, and any other edge-node associated with the near-edge node 240 and thus that a new ML model is needed. When this happens, the drift detection engine 652 causes that an aggregate drift dataset 662 be generated. The aggregate drift dataset 662 is a joining of the drift datasets 620, 640, and any drift datasets received from any other edge-nodes associated with the near-edge node 240. The aggregate drift dataset 662 may then be sent to the central node 210 for use in the selection of a new model as will be explained in more detail to follow.

In some embodiments, the drift detection engine 652 performs two steps or processes when comparing the aggregate drift metric score 658 with the aggregate drift threshold 654. During the first step, which can be referred to as a "yellow flag", the drift detection engine 652 begins the generation of the aggregate drift dataset 662 when it is determined that the aggregate drift metric score is equal to or higher than the aggregate drift threshold 654. During the second step, which can be referred to as a "red flag", the drift detection engine 652 sends a retrain message 666 to the central node 210 indicating that the model retraining is needed. In one embodiment, the retrain message 666 may include the aggregate drift dataset 662 and an ID 664 that identifies the dataset as being received from the near-edge node 240.

Once the central node 210 receives the message 666 from the near-edge node 240, the central node will begin to select a best new ML model for deployment at the near-edge node 240 and the edge-nodes 245 and 246. As mentioned above, the central node 210 is operating during what is previously referred to as the post-Ideal World. Thus, the central node 210 has accumulated the dataset $D_{Ideal}$ 340 and has trained the ML models $M_1$ 410, $M_2$ 420, ..., $M_z$ 430 in the manner previously described.

Figure 6B:
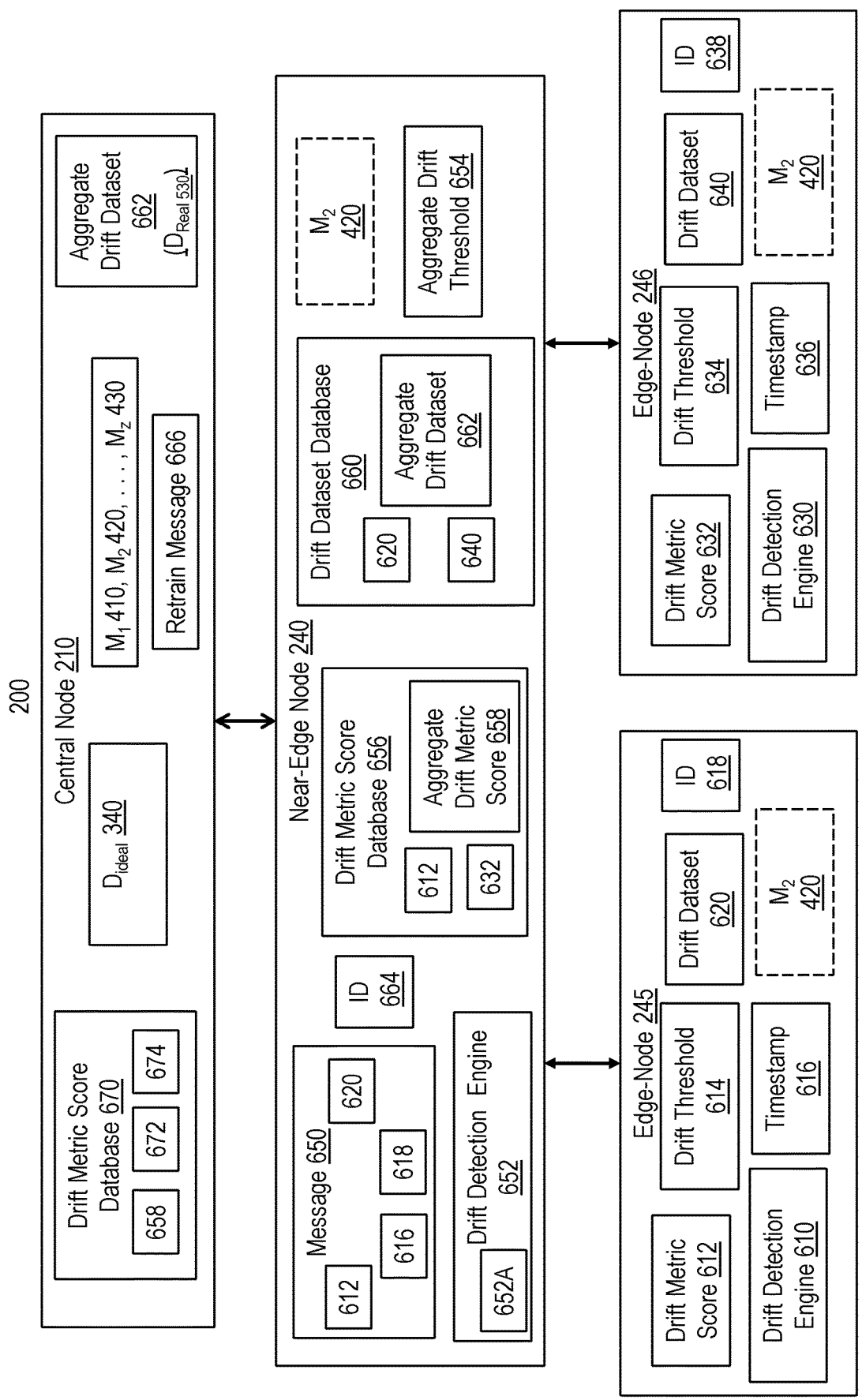

In the embodiment, the central node 210 uses the aggregate drift dataset 662, which is the current dataset for the near-edge node 240 (accumulated from the time of the "yellow flag" to that of the "red flag" message 666) to train the ML models $M_1$ 410, $M_2$ 420, ..., $M_z$ 430. In particular, the central node 210 treats the aggregate drift dataset 662 as if it were the dataset $D_{Real}$ 530 (as illustrated by the parenthesis the figure) while training the ML models $M_1$ 410, $M_2$ 420, ..., $M_z$ 430. Thus, the central node 210 will use the bootstrap error and model convergence as previously described in relation to FIGS. 5A-5C to select the best ML model based on the current dataset of the edge node 240. As shown in FIG. 6B, in the embodiment the central node selects the ML model $M_2$ 420 for deployment on the near-edge node 240 and the edge-nodes 245, 246, and any other edge-node associated with the near-edge node 240.

E. Ideal World Reset

As discussed above, model drift may occur at a given edge-node. It is possible, however, for major model drift to occur across multiple near-edge nodes and their associated edge-nodes. Advantageously, the embodiments disclosed herein provide for a process to collect new data to build a new "Ideal World" dataset and then to retrain ML models from scratch using the new Ideal World dataset. Real World data is also collected and the bootstrap error is used to select the best ML for each near-edge node. Thus, the embodiments disclosed herein provide for a way to correct major model drift in the logistic system 200. This process will now be explained.

Figure 8:
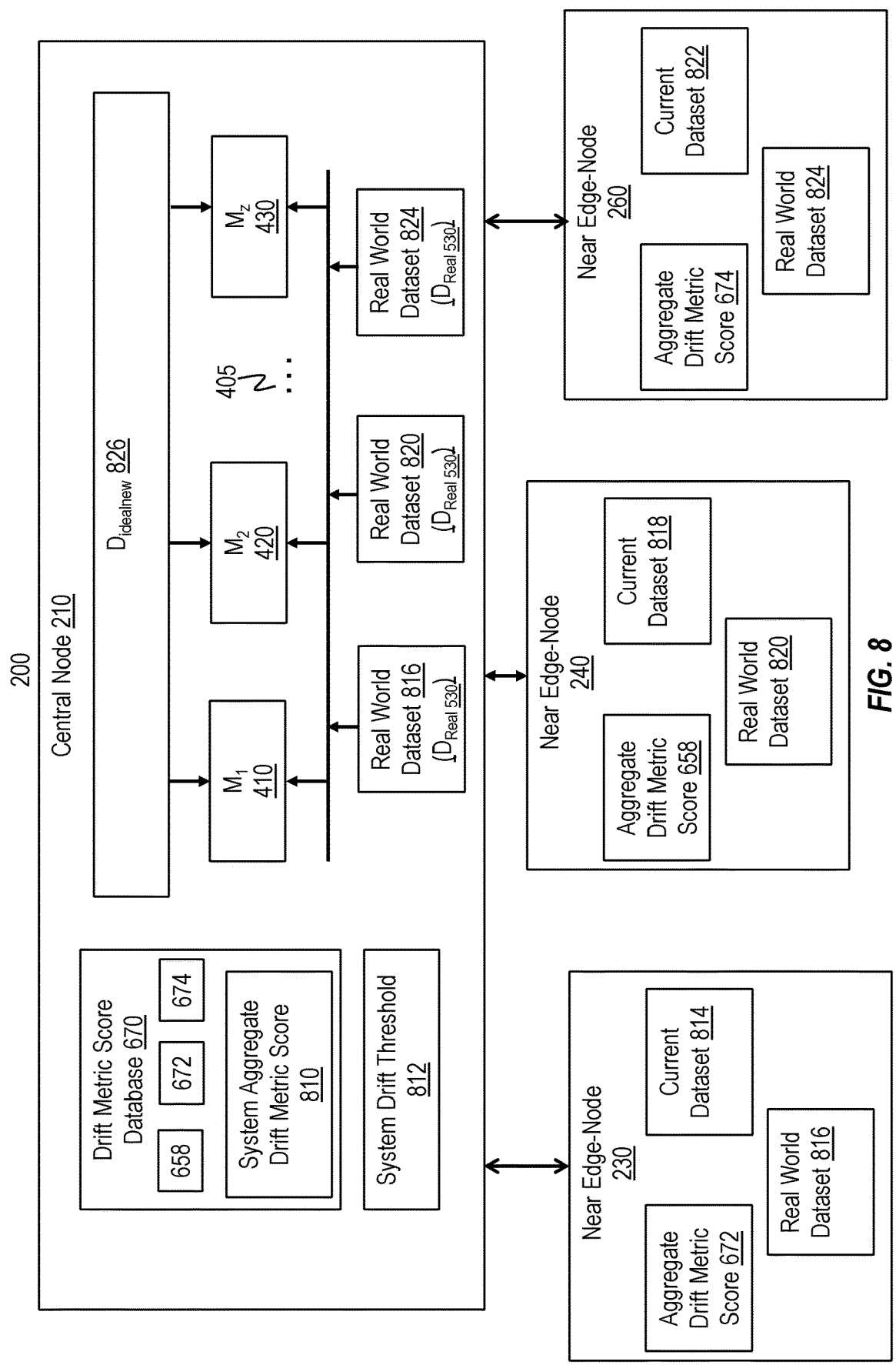
FIG. 8 illustrates the central node of the logistics system of FIG. 2 automatically selecting a ML model based on resetting the Ideal World.

FIG. 8 illustrates an embodiment of the logistics system 200, which for ease of illustration only shows some of the elements of the previously described embodiments. Thus, FIG. 8 illustrates the central node 210 and the near-edge nodes 230, 240, and 260. It will be appreciated that the discussion related to the near-edge nodes 230, 240, and 260 may also apply to any other near-edge nodes of the logistics system 200.

As previously described in relation to FIG. 6A, the near-edge nodes 230, 240, and 260 periodically send aggregate drift metric scores to the central node 210. Thus, the near-edge node 230 sends the aggregate drift metric score 672, the near-edge node 240 sends the aggregate drift metric score 658, and the near-edge node 260 sends the aggregate drift metric score 674, all of which are stored at the central node in the drift metric score database 670.

The central node will periodically calculate a system aggregate drift metric score 810 based on the aggregate drift metric score 658, 672, and 674. In one embodiment, the system aggregate drift metric score 810 may be calculated using any reasonable calculation. The central node 210 also includes a system drift threshold 812 that is configured to indicate if the Ideal World needs to be reset due to major model drift. In other words, the system drift threshold 812 indicates if the dataset $D_{Ideal}$ 340 is still valid for the logistic system 200.

The central node 210 compares the system aggregate drift metric score 810 with the system drift threshold 812. If the system aggregate drift metric score 810 is equal to or larger than the system drift threshold 812, the central node 210 triggers a new Ideal World dataset collection process and a signal is sent to all the near-edge nodes. In other words, the central node begins a collection of datasets in the manner discussed previously with respect to FIG. 3.

Each of the near-edge nodes 230, 240, and 260, upon receiving the signal from the central node 210, stops their current data gathering process (e.g., caching datasets) and performs two steps: (1) share their current cached dataset with the central node; and (2) start a new process of dataset collection. Thus, the near-edge node 230 shares a current dataset 814 with the central node 210, the near-edge node 240 shares a current dataset 818 with the central node 210, and the near-edge node 260 shares a current dataset 822 with the central node 210 in response to step (1). In addition, the near-edge nodes 230, 240, and 260 continue to provide updated current datasets 814, 818, and 822 to the central node 210 in response to step (2) in the manner discussed previously with respect to FIG. 3.

The data collection at the near-edge nodes 230, 240, and 260 (i.e., step 2) will continuously run until there are sufficient datasets accumulated at the central node 210 to determine a new Ideal World dataset. The number of datasets each near-edge should gather is determined by the number of datasets required by the central node 210 to determine the new Ideal World dataset. In one embodiment, the central node 210 starts by defining an ideal amount of Ideal World data and then dividing this amongst all near-edge nodes (either through a simple equal division or a more refined method). This number received by each near-edge node 230, 240, and 250 is then used as a reference number for the near-edge nodes while gathering the datasets.

Once the central node 210 has accumulated enough datasets from the near-edge nodes 230, 240, and 260, the central joins the datasets into a new Ideal World dataset. As illustrated in FIG. 8, the central node generates the dataset $D_{Idealnew}$ 826 as the new Ideal World dataset. Thus, the "Ideal World" has been reset. As shown in FIG. 8, the central node uses the dataset $D_{Idealnew}$ 826 to train and test the ML models $M_1$ 410, $M_2$ 420, . . . , $M_z$ 430 in the manner previously described.

After the generation of the dataset $D_{Idealnew}$ 826, the central node 210 sends out another dataset collection signal to the near-edge nodes 230, 240, and 260, which instructs the near-edge nodes to provide their most recent current dataset to the central node. In FIG. 8, this dataset is referred as a Real World dataset. Thus, near-edge node 230 shares a Real World dataset 816 with the central node 210, the near-edge node 240 shares a Real World dataset 820 with the central node 210, and the near-edge node 260 shares a Real World dataset 824 with the central node 210.

Once the Real World datasets are received by the central node 210, the central node 210 uses these datasets to train the ML models $M_1$ 410, $M_2$ 420, . . . , $M_z$ 430. In particular, the central node 210 treats the Real World datasets 816, 820, and 824 as if they were the dataset $D_{Real}$ 530 (as illustrated by the parenthesis the figure) while training the ML models $M_1$ 410, $M_2$ 420, . . . , $M_z$ 430. Thus, the central node 210 will use the bootstrap error and model convergence as previously described in relation to FIGS. 5A-5C to select the best new ML model for each of the near-edge nodes 230, 240, 260, and any other near-edge node of the logistics system 200. The near-edge nodes will in turn deploy the newly selected ML model at the edge-nodes they are associated with. In this way, the logistics system 200 is able to retrain the ML models after major model drift to advantageously ensure that the edge-nodes of the system have the best current ML model running on them, thus helping to maintain system performance.

F. Example Methods

Figure 7:
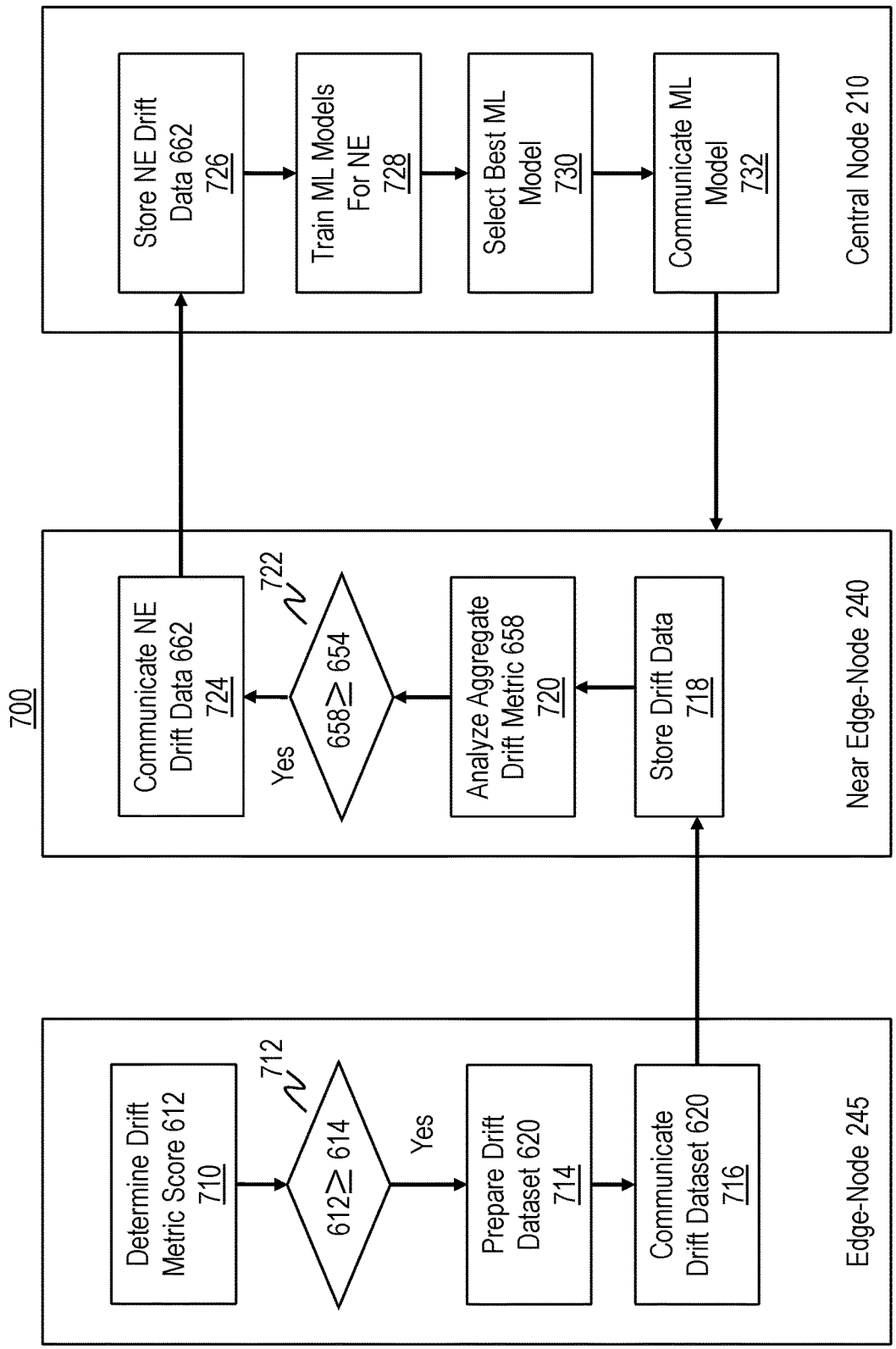
FIG. 7 illustrates a flowchart of an example method for automatically selecting a ML model based on model drift monitoring.
Figure 9:
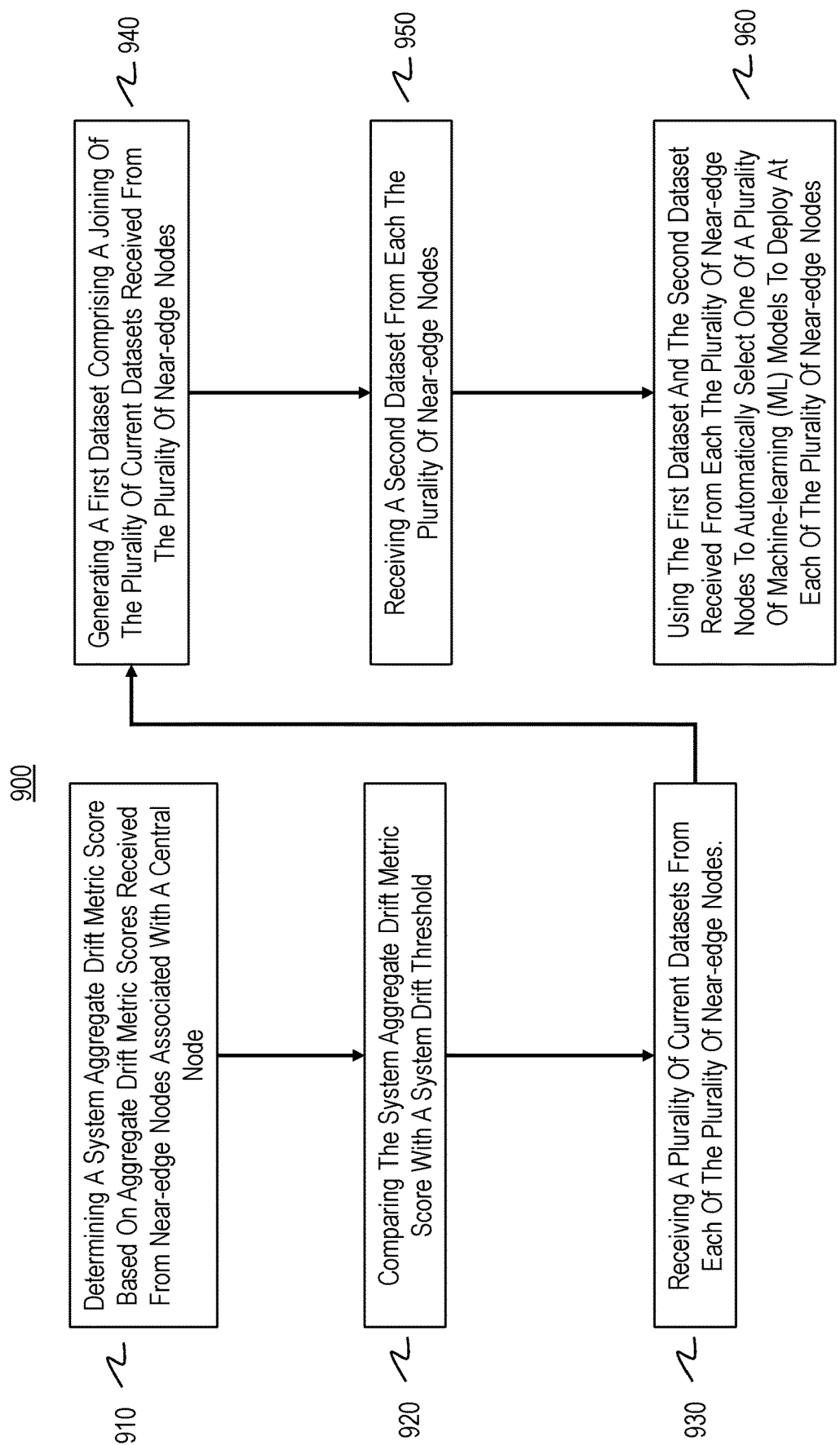
FIG. 9 illustrates a flowchart of an example method for automatically selecting a ML model based on resetting the Ideal World.

It is noted with respect to the disclosed methods, including the example methods of FIGS. 7 and 9, that any operation(s) of any of these methods, may be performed in response to, as a result of, and/or based upon, the performance of any preceding operation(s). Correspondingly, performance of one or more operations, for example, may be a predicate or trigger to subsequent performance of one or more additional operations. Thus, for example, the various operations that may make up a method may be linked together or otherwise associated with each other by way of relations such as the examples just noted. Finally, and while it is not required, the individual operations that make up the various example methods disclosed herein are, in some embodiments, performed in the specific sequence recited in those examples. In other embodiments, the individual operations that make up a disclosed method may be performed in a sequence other than the specific sequence recited.

FIG. 7 illustrates a flow chart 700 of an embodiment of the process flow described in relation to FIGS. 6A and 6B to monitor for model drift. Although certain elements are described as performing certain actions, this is for illustration only. It will be appreciated that other elements may also be able to perform the described action and that some actions may be performed by a combination of more than one element. Further, it will be appreciated that more actions may be performed in addition to the actions that are described.

As illustrated, the flow chart 700 illustrates the actions of the edge-node 245, the near-edge node 240, and the central node 210. At step 710, the edge-node 245, specifically the drift detection engine 610, determines the drift metric score 612. At decision block 712, the drift detection engine 610 compares the drift metric score 612 with the drift threshold 614. When it is determined in decision block 712 that the drift metric score 612 is equal to or larger than the drift threshold 614, the drift detection engine 610 prepares the drift dataset 620 in step 714 and sends the drift dataset 620 to the near-edge node 240 in step 716 using the message 650.

At step 718, the near-edge node 240 stores the drift dataset 620 in the drift dataset database 660. At step 720, the drift detection engine 652 analyzes the aggregate drift metric score 658 and at decision block 722 compares the aggregate drift metric score 658 with the aggregate drift threshold 654. When it is determined in decision block 722 that the aggregate drift metric score 658 is equal to or larger than the aggregate drift threshold 654, at step 724 the aggregate drift dataset 662 is sent to the central node 210 in the message 666.

At step 726, the central node 210 stores the aggregate drift dataset 662. At step 728 the central nodes trains the ML models $M_1$ 410, $M_2$ 420, . . . , $M_z$ 430 using the dataset $D_{Ideal}$ 340 and the aggregate drift dataset 662, which acts as the dataset $D_{Real}$ 530. At step 730, the central node 210 selects the best ML model using the bootstrap error and model convergence as previously described. At step 732, the central node 210 sends the selected best ML model to the near-edge node 240 for deployment on the near-edge node 240 and the edge-nodes 245, 246, and any other edge-nodes associated with the near-edge node 240. The process flow described in flow chart 700 may be repeated any time that model drift is detected by one of the edge-nodes and/or the near-edge node 240.

Directing attention now to FIG. 9, an example method 900 for a central node to reset an Ideal World is disclosed. The method 900 will be described in relation to one or more of the figures previously described, although the method 900 is not limited to any particular embodiment.

The method 900 includes determining, at a central node of a logistics system, a system aggregate drift metric score based on a plurality of aggregate drift metric scores received from a plurality of near-edge nodes associated with the central node, the system aggregate drift metric score being indicative of a level of model drift across the logistics system (910). For example, as previously described the central node 210 determines the system aggregate drift metric score 810 based on the aggregate drift metric scores 658, 672, and 674.

The method 900 includes comparing the system aggregate drift metric score with a system drift threshold (920). For example, as previously described the central node 210 compares system aggregate drift metric score 810 with the system drift threshold 812.

The method 900 includes in response to the system aggregate drift metric score being equal to or greater than then system drift threshold, receiving a plurality of current datasets from each of the plurality of near-edge nodes (930). For example, as previously described the central node 210 receives the current datasets 814, 818, and 822.

The method 900 includes generating a first dataset comprising a joining of the plurality of current datasets received from the plurality of near-edge nodes (940). For example, as previously described the central node 210 generates the dataset $D_{Idealnew}$ 826 in the manner previously described.

The method 900 includes receiving a second dataset from each the plurality of near-edge nodes (950). For example, as previously described the central node 210 receives the Real world datasets 816, 820, and 824.

The method 900 includes using the first dataset and the second dataset received from each the plurality of near-edge nodes to automatically select one of a plurality of machine-learning (ML) models to deploy at each of the plurality of near-edge nodes (960). For example, as the central node 210 automatically selects a ML model to be deployed at the near-edge nodes in the manner previously described.

G. Further Example Embodiments

Following are some further example embodiments of the invention. These are presented only by way of example and are not intended to limit the scope of the invention in any way.

Embodiment 1. A method, comprising: determining, at a central node of a logistics system, a system aggregate drift metric score based on a plurality of aggregate drift metric scores received from a plurality of near-edge nodes associated with the central node, the system aggregate drift metric score being indicative of a level of model drift across the logistics system; comparing the system aggregate drift metric score with a system drift threshold, in response to the system aggregate drift metric score being equal to or greater than then system drift threshold, receiving a plurality of current datasets from each of the plurality of near-edge nodes; generating a first dataset comprising a joining of the plurality of current datasets received from the plurality of near-edge nodes; receiving a second dataset from each the plurality of near-edge nodes; and using the first dataset and the second dataset received from each the plurality of near-edge nodes to automatically select one of a plurality of machine-learning (ML) models to deploy at each of the plurality of near-edge nodes.

Embodiment 2. The method of embodiment 1, wherein selecting the one of the plurality of ML models comprises: determining a first test error for each of the plurality of ML models when the ML models are trained using the first dataset, the first dataset comprising a joining of a plurality of datasets obtained from a plurality of near-edge nodes; determining a second test error for each of the plurality of ML models when the plurality of ML models are trained using the second dataset received from each of the plurality of near-edge nodes; determining a bootstrap error for each of the plurality of ML models based on the first and second test errors; and determining a convergence value for each of the plurality of ML models when the ML models are trained using the first dataset.

Embodiment 3. The method of embodiments 1-2, further comprising: comparing the bootstrap error for each of the plurality of ML models to a second threshold value; and discarding those ML models that have a bootstrap error that is larger than the second threshold value.

Embodiment 4. The method of embodiments 3, wherein determining a bootstrap error comprises: calculating a difference between the second test error and the first test error.

Embodiment 5. The method of embodiments 1-2, wherein determining a convergence value for each of the plurality of ML models when the ML models are trained using the first dataset comprises: evaluating a training loss curve for each of the plurality of ML models; and determining a convergence value based on the training loss curve.

Embodiment 6. The method of embodiments 1-5, wherein the plurality of near-edge nodes are a warehouse.

Embodiment 7. The method of embodiment 6, wherein the plurality of near-edge nodes are associated with one or more edge-nodes that operate in the warehouse, wherein the one or more edge-nodes comprise one of a forklift or an Autonomous Mobile Robot (AMR).

Embodiment 8. The method of embodiments 1-7, wherein the plurality of aggregate drift metric scores are periodically received from the plurality of near-edge nodes.

Embodiment 9. The method of embodiments 1-8, wherein the plurality of current datasets received from the plurality of near-edge nodes are continuously received until a predetermined number of datasets have been received.

Embodiment 10. The method of embodiments 1-9, wherein the selected ML model that is deployed at each of the plurality of near-edge nodes is configured to control an operation of one or more edge-nodes associated with each of the plurality of near-edge nodes.

Embodiment 11. A system, comprising hardware and/or software, operable to perform any of the operations, methods, or processes, or any portion of any of these, disclosed herein.

Embodiment 12. A non-transitory storage medium having stored therein instructions that are executable by one or more hardware processors to perform operations comprising the operations of any one or more of embodiments 1-10.

Embodiment 13. A method, comprising: receiving, at a central node of a logistics system, a first drift dataset from one or more near-edge nodes that are associated with the central node, the first drift dataset being sent to the central node when a first drift metric score indicative of a first level of model drift in the one or more near-edge nodes is equal to or greater than a first drift threshold; using the first drift dataset to training a plurality of machine-learning (ML) models, the plurality of ML models being configured to control the operation of one or more edge-nodes that are associated with each of the plurality of near-edge nodes; using the first drift dataset to select one of a plurality of ML models to deploy at the one or more near-edge nodes; and communicating the selected ML model to the one or more near-edge nodes.

Embodiment 14. The method of embodiment 13, wherein the first drift dataset is a joining of second drift datasets received at the one or more near-edge nodes from the one or more edge-nodes that are associated with the one or more near-edge nodes, the second drift datasets being sent to the one or more near-edge nodes when a second drift metric score indicative of a second level of model drift in the one or more edge-nodes is equal to or greater than a first drift threshold.

Embodiment 15. The method of embodiments 13-14, wherein selecting the one of the plurality of ML models comprises: determining a first test error for each of the plurality of ML models when the ML models are trained using a first dataset, the first dataset comprising a joining of a plurality of datasets obtained from the one or more near-edge nodes; determining a second test error for each of the plurality of ML models when the plurality of ML models are trained using the first drift dataset received from the one or more near-edge nodes; determining a bootstrap error for each of the plurality of ML models based on the first and second test errors; and determining a convergence value for each of the plurality of ML models when the ML models are trained using the first dataset.

Embodiment 16. The method of embodiments 15, further comprising: comparing the bootstrap error for each of the plurality of ML models to a third threshold value; and discarding those ML models that have a bootstrap error that is larger than the third threshold value.

Embodiment 17. The method of embodiment 16, wherein determining a bootstrap error comprises: calculating a difference between the second test error and the first test error.

Embodiment 18. The method of embodiments 13-17, wherein determining a convergence value for each of the plurality of ML models when the ML models are trained using the first dataset comprises: evaluating a training loss curve for each of the plurality of ML models; and determining a convergence value based on the training loss curve.

Embodiment 19. The method of embodiments 13-18, wherein the plurality of near-edge nodes are a warehouse.

Embodiment 20. The method of embodiment 19, wherein the one or more edge-nodes comprise one of a forklift or an Autonomous Mobile Robot (AMR) that operate in the warehouse.

Embodiment 21. The method of embodiments 13-20, wherein the first drift dataset is stored at the central node.

Embodiment 22. The method of embodiments 13-21, wherein the selected ML model that is deployed at the one or more near-edge nodes is configured to control an operation of the one or more edge-nodes associated with each of the plurality of near-edge nodes.

Embodiment 23. A system, comprising hardware and/or software, operable to perform any of the operations, methods, or processes, or any portion of any of these, disclosed herein.

Embodiment 24. A non-transitory storage medium having stored therein instructions that are executable by one or more hardware processors to perform operations comprising the operations of any one or more of embodiments 13-22.

H. Example Computing Devices and Associated Media

Finally, because the principles described herein may be performed in the context of a computing system some introductory discussion of a computing system will be described with respect to FIG. 10. Computing systems are now increasingly taking a wide variety of forms. Computing systems may, for example, be hand-held devices, appliances, laptop computers, desktop computers, mainframes, distributed computing systems, data centers, or even devices that have not conventionally been considered a computing system, such as wearables (e.g., glasses). In this description and in the claims, the term "computing system" is defined broadly as including any device or system (or a combination thereof) that includes at least one physical and tangible processor, and a physical and tangible memory capable of having thereon computer-executable instructions that may be executed by a processor. The memory may take any form and may depend on the nature and form of the computing system. A computing system may be distributed over a network environment and may include multiple constituent computing systems.

Figure 10:
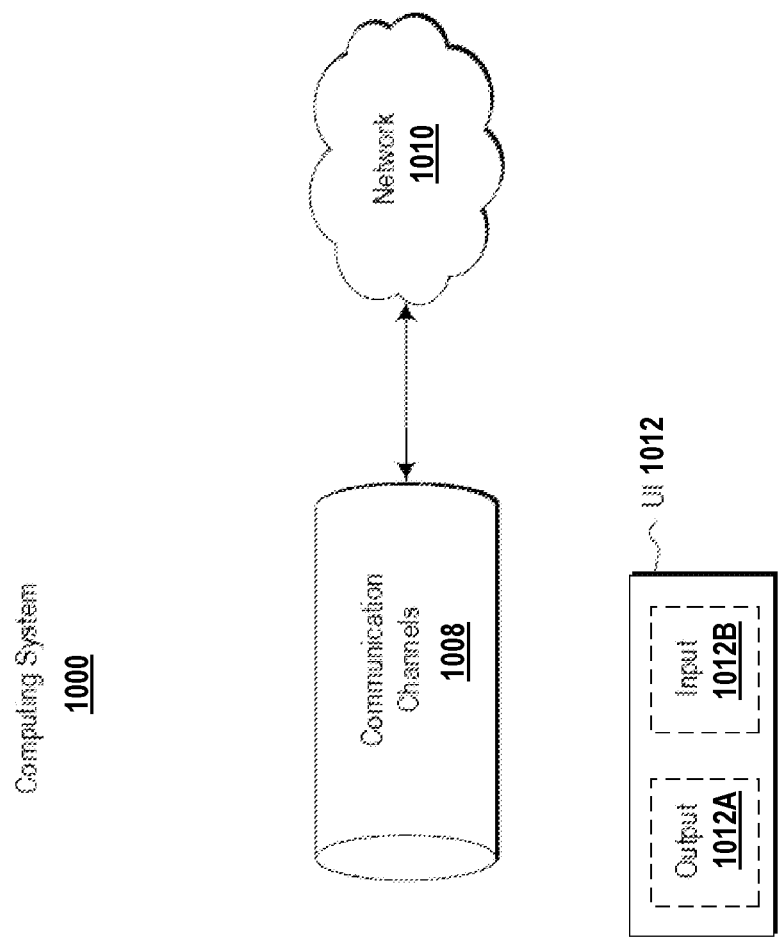
FIG. 10 illustrates an example computing system in which the embodiment described herein may be employed.

As illustrated in FIG. 10, in its most basic configuration, a computing system 1000 typically includes at least one hardware processing unit 1002 and memory 1004. The processing unit 1002 may include a general-purpose processor and may also include a field-programmable gate array (FPGA), an application-specific integrated circuit (ASIC), or any other specialized circuit. The memory 1004 may be physical system memory, which may be volatile, non-volatile, or some combination of the two. The term "memory" may also be used herein to refer to non-volatile mass storage such as physical storage media. If the computing system is distributed, the processing, memory and/or storage capability may be distributed as well.

The computing system 1000 also has thereon multiple structures often referred to as an "executable component". For instance, memory 1004 of the computing system 1000 is illustrated as including executable component 1006. The term "executable component" is the name for a structure that is well understood to one of ordinary skill in the art in the field of computing as being a structure that can be software, hardware, or a combination thereof. For instance, when implemented in software, one of ordinary skill in the art would understand that the structure of an executable component may include software objects, routines, methods, and so forth, that may be executed on the computing system, whether such an executable component exists in the heap of a computing system, or whether the executable component exists on computer-readable storage media.

In such a case, one of ordinary skill in the art will recognize that the structure of the executable component exists on a computer-readable medium such that, when interpreted by one or more processors of a computing system (e.g., by a processor thread), the computing system is caused to perform a function. Such a structure may be computer-readable directly by the processors (as is the case if the executable component were binary). Alternatively, the structure may be structured to be interpretable and/or compiled (whether in a single stage or in multiple stages) so as to generate such binary that is directly interpretable by the processors. Such an understanding of example structures of an executable component is well within the understanding of one of ordinary skill in the art of computing when using the term "executable component".

The term "executable component" is also well understood by one of ordinary skill as including structures, such as hardcoded or hard-wired logic gates, which are implemented exclusively or near-exclusively in hardware, such as within a field-programmable gate array (FPGA), an application-specific integrated circuit (ASIC), or any other specialized circuit. Accordingly, the term "executable component" is a term for a structure that is well understood by those of ordinary skill in the art of computing, whether implemented in software, hardware, or a combination. In this description, the terms "component", "agent," "manager", "service", "engine", "module", "virtual machine" or the like may also be used. As used in this description and in the case, these terms (whether expressed with or without a modifying clause) are also intended to be synonymous with the term "executable component", and thus also have a structure that is well understood by those of ordinary skill in the art of computing.

In the description above, embodiments are described with reference to acts that are performed by one or more computing systems. If such acts are implemented in software, one or more processors (of the associated computing system that performs the act) direct the operation of the computing system in response to having executed computer-executable instructions that constitute an executable component. For example, such computer-executable instructions may be embodied in one or more computer-readable media that form a computer program product. An example of such an operation involves the manipulation of data. If such acts are implemented exclusively or near-exclusively in hardware, such as within an FPGA or an ASIC, the computer-executable instructions may be hardcoded or hard-wired logic gates. The computer-executable instructions (and the manipulated data) may be stored in the memory 1004 of the computing system 1000. Computing system 1000 may also contain communication channels 1008 that allow the computing system 1000 to communicate with other computing systems over, for example, network 1010.

While not all computing systems require a user interface, in some embodiments, the computing system 1000 includes a user interface system 1012 for use in interfacing with a user. The user interface system 1012 may include output mechanisms 1012A as well as input mechanisms 1012B. The principles described herein are not limited to the precise output mechanisms 1012A or input mechanisms 1012B as such will depend on the nature of the device. However, output mechanisms 1012A might include, for instance, speakers, displays, tactile output, holograms, and so forth. Examples of input mechanisms 1012B might include, for instance, microphones, touchscreens, holograms, cameras, keyboards, mouse or other pointer input, sensors of any type, and so forth.

Embodiments described herein may comprise or utilize a special purpose or general-purpose computing system, including computer hardware, such as, for example, one or more processors and system memory, as discussed in greater detail below. Embodiments described herein also include physical and other computer-readable media for carrying or storing computer-executable instructions and/or data structures. Such computer-readable media can be any available media that can be accessed by a general-purpose or special-purpose computing system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: storage media and transmission media.

Computer-readable storage media includes RAM, ROM, EEPROM, CD-ROM, or other optical disk storage, magnetic disk storage, or other magnetic storage devices, or any other physical and tangible storage medium which can be used to store desired program code means in the form of computer-executable instructions or data structures and which can be accessed by a general-purpose or special-purpose computing system.

A "network" is defined as one or more data links that enable the transport of electronic data between computing systems and/or modules and/or other electronic devices. When information is transferred or provided over a network or another communications connection (either hard-wired, wireless, or a combination of hard-wired or wireless) to a computing system, the computing system properly views the connection as a transmission medium. Transmission media can include a network and/or data links that can be used to carry desired program code means in the form of computer-executable instructions or data structures and which can be accessed by a general-purpose or special-purpose computing system. Combinations of the above should also be included within the scope of computer-readable media.

Further, upon reaching various computing system components, program code means in the form of computer-executable instructions or data structures can be transferred automatically from transmission media to storage media (or vice versa). For example, computer-executable instructions or data structures received over a network or data link can be buffered in RAM within a network interface module (e.g., a "NIC"), and then eventually transferred to computing system RAM and/or to less volatile storage media at a computing system. Thus, it should be understood that storage media can be included in computing system components that also (or even primarily) utilize transmission media.

Computer-executable instructions comprise, for example, instructions and data which, when executed at a processor, cause a general-purpose computing system, special purpose computing system, or special purpose processing device to perform a certain function or group of functions. Alternatively, or in addition, the computer-executable instructions may configure the computing system to perform a certain function or group of functions. The computer-executable instructions may be, for example, binaries or even instructions that undergo some translation (such as compilation) before direct execution by the processors, such as intermediate format instructions such as assembly language or even source code.

Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computing system configurations, including personal computers, desktop computers, laptop computers, message processors, hand-held devices, multi-processor systems, microprocessor-based or programmable consumer electronics, network PCs, minicomputers, mainframe computers, mobile telephones, PDAS, pagers, routers, switches, data centers, wearables (such as glasses) and the like. The invention may also be practiced in distributed system environments where local and remote computing systems, which are linked (either by hard-wired data links, wireless data links, or by a combination of hard-wired and wireless data links) through a network, both perform tasks. In a distributed system environment, program modules may be located in both local and remote memory storage devices.

Those skilled in the art will also appreciate that the invention may be practiced in a cloud computing environment. Cloud computing environments may be distributed, although this is not required. When distributed, cloud computing environments may be distributed internationally within an organization and/or have components possessed across multiple organizations. In this description and the following claims, "cloud computing" is defined as a model for enabling on-demand network access to a shared pool of configurable computing resources (e.g., networks, servers, storage, applications, and services). The definition of "cloud computing" is not limited to any of the other numerous advantages that can be obtained from such a model when properly deployed.

The remaining figures may discuss various computing systems which may correspond to the computing system 1000 previously described. The computing systems of the remaining figures include various components or functional blocks that may implement the various embodiments disclosed herein, as will be explained. The various components or functional blocks may be implemented on a local computing system or may be implemented on a distributed computing system that includes elements resident in the cloud or that implement aspect of cloud computing. The various components or functional blocks may be implemented as software, hardware, or a combination of software and hardware. The computing systems of the remaining figures may include more or less than the components illustrated in the figures, and some of the components may be combined as circumstances warrant. Although not necessarily illustrated, the various components of the computing systems may access and/or utilize a processor and memory, such as processing unit 1002 and memory 1004, as needed to perform their various functions.

For the processes and methods disclosed herein, the operations performed in the processes and methods may be implemented in differing order. Furthermore, the outlined operations are only provided as examples, and some of the operations may be optional, combined into fewer steps and operations, supplemented with further operations, or expanded into additional operations without detracting from the essence of the disclosed embodiments.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:
   determining, at a central node of a logistics system, a system aggregate drift metric score based on a plurality of aggregate drift metric scores received from a plurality of near-edge nodes associated with the central node, the system aggregate drift metric score being indicative of a level of model drift across the logistics system;
   comparing the system aggregate drift metric score with a system drift threshold,
   in response to the system aggregate drift metric score being equal to or greater than the system drift threshold, receiving a plurality of current datasets from each of the plurality of near-edge nodes;
   generating a first dataset comprising a joining of the plurality of current datasets received from the plurality of near-edge nodes;
   receiving a second dataset from each the plurality of near-edge nodes; and
   using the first dataset and the second dataset received from each of the plurality of near-edge nodes to automatically select one of a plurality of machine-learning (ML) models to deploy at each of the plurality of near-edge nodes.

2. The method of claim 1, wherein selecting the one of the plurality of ML models comprises:
   determining a first test error for each of the plurality of ML models when the ML models are trained using the first dataset;
   determining a second test error for each of the plurality of ML models when the plurality of ML models are trained using the second dataset received from each of the plurality of near-edge nodes;
   determining a bootstrap error for each of the plurality of ML models based on the first and second test errors; and
   determining a convergence value for each of the plurality of ML models when the ML models are trained using the first dataset.

3. The method of claim 2, further comprising:
   comparing the bootstrap error for each of the plurality of ML models to a second threshold value; and
   discarding those ML models that have the bootstrap error #Ast is larger than the second threshold value.

4. The method of claim 3, wherein determining & the bootstrap error comprises:
   calculating a difference between the second test error and the first test error.

5. The method of claim 2, wherein determining convergence value for each of the plurality of ML models when the ML models are trained using the first dataset comprises:
   evaluating a training loss curve for each of the plurality of ML models; and
   determining the convergence value based on the training loss curve.

6. The method of claim 1, wherein one or more near-edge nodes in the plurality of near-edge nodes is a warehouse.

7. The method of claim 6, wherein the one or more near-edge nodes in the plurality of near-edge nodes are associated with one or more edge-nodes that operate in the warehouse, wherein the one or more edge-nodes comprise one of a forklift or an Autonomous Mobile Robot (AMR).

8. The method of claim 1, wherein the plurality of aggregate drift metric scores are periodically received from the plurality of near-edge nodes.

9. The method of claim 1, wherein the plurality of current datasets received from the plurality of near-edge nodes are continuously received until a pre-determined number of datasets have been received.

10. The method of claim 1, wherein the selected ML model that is deployed at each of the plurality of near-edge nodes is configured to control an operation of one or more edge-nodes associated with each of the plurality of near-edge nodes.

11. A method, comprising:
    receiving, at a central node of a logistics system, a first drift dataset from one or more near-edge nodes that are associated with the central node, the first drift dataset being sent to the central node when a first drift metric score indicative of a first level of model drift in the one or more near-edge nodes is equal to or greater than a first drift threshold;
    using the first drift dataset to train a plurality of machine-learning (ML) models, the plurality of ML models being configured to control an operation of one or more edge-nodes that are associated with each of the plurality of near-edge nodes;
    using the first drift dataset to automatically select one of a plurality of ML models to deploy at the one or more near-edge nodes; and
    communicating the selected ML model to the one or more near-edge nodes.

12. The method of claim 11, wherein the first drift dataset is a joining of second drift datasets received at the one or more near-edge nodes from the one or more edge-nodes that are associated with the one or more near-edge nodes, the second drift datasets being sent to the one or more near-edge nodes when a second drift metric score indicative of a second level of model drift in the one or more edge-nodes is equal to or greater than a first drift threshold.

13. The method of claim 11, wherein selecting the one of the plurality of ML models comprises:
    determining a first test error for each of the plurality of ML models when the ML models are trained using a first dataset;

determining a second test error for each of the plurality of ML models when the plurality of ML models are trained using the first drift dataset received from the one or more near-edge nodes;

determining a bootstrap error for each of the plurality of ML models based on the first and second test errors; and determining a convergence value for each of the plurality of ML models when the ML models are trained using the first dataset.

14. The method of claim 13, further comprising:

comparing the bootstrap error for each of the plurality of ML models to a third threshold value; and discarding those ML models that have the bootstrap error What is larger than the third threshold value.

15. The method of claim 14, wherein determining the bootstrap error comprises:

calculating a difference between the second test error and the first test error.

16. The method of claim 13, wherein determining the convergence value for each of the plurality of ML models when the ML models are trained using the first dataset comprises:

evaluating a training loss curve for each of the plurality of ML models; and determining the convergence value based on the training loss curve.

17. The method of claim 11, wherein one or more near-edge nodes in the plurality of near-edge nodes is a warehouse.

18. The method of claim 17, wherein the one or more edge-nodes comprise one of a forklift or an Autonomous Mobile Robot (AMR) that operate in the warehouse.

19. The method of claim 11, wherein the first drift dataset is stored at the central node.

20. The method of claim 11, wherein the selected ML model that is deployed at the one or more near-edge nodes is configured to control an operation of the one or more edge-nodes associated with each of the plurality of near-edge nodes.

* * * * *